(12) United States Patent
Matsumoto et al.

(10) Patent No.: US 8,575,532 B2
(45) Date of Patent: Nov. 5, 2013

(54) SOLID-STATE IMAGING DEVICE AND DRIVING METHOD OF SOLID-STATE IMAGING DEVICE

(75) Inventors: Hiroshi Matsumoto, Osaka (JP); Mamoru Iesaka, Kanagawa (JP); Sei Suzuki, Osaka (JP); Katsuya Furukawa, Shiga (JP)

(73) Assignee: Panasonic Corporation, Osaka (JP)

( * ) Notice: Subject to any disclaimer, the term of this patent is extended or adjusted under 35 U.S.C. 154(b) by 104 days.

(21) Appl. No.: 13/338,727

(22) Filed: Dec. 28, 2011

(65) Prior Publication Data
US 2012/0168608 A1 Jul. 5, 2012

Related U.S. Application Data

(63) Continuation of application No. PCT/JP2010/004252, filed on Jun. 28, 2010.

(30) Foreign Application Priority Data

Jul. 10, 2009 (JP) ................................. 2009-164252
Mar. 29, 2010 (JP) ................................. 2010-076125

(51) Int. Cl.
*H01L 27/00* (2006.01)
(52) U.S. Cl.
USPC .................................. 250/208.1; 250/214 R
(58) Field of Classification Search
USPC ................ 250/208.1, 214 R; 348/220.1, 248, 348/319–322, 266–275, 281–311; 257/228, 257/229, 290–294, 440
See application file for complete search history.

(56) References Cited

U.S. PATENT DOCUMENTS

| 5,528,291 | A | * | 6/1996 | Oda ........................... 348/220.1 |
|---|---|---|---|---|
| 6,541,805 | B1 | | 4/2003 | Suzuki |
| 8,085,331 | B2 | | 12/2011 | Kato et al. |
| 2001/0023919 | A1 | | 9/2001 | Konishi |
| 2009/0160993 | A1 | | 6/2009 | Kato et al. |

FOREIGN PATENT DOCUMENTS

| JP | 59-201589 | 11/1984 |
|---|---|---|
| JP | 62-76764 | 8/1987 |
| JP | 63-62480 | 3/1988 |
| JP | 64-77381 | 3/1989 |
| JP | 03-240379 | 10/1991 |
| JP | 06-204451 | 7/1994 |
| JP | 8-31588 | 3/1996 |
| JP | 2001-111026 | 4/2001 |
| JP | 2001-267548 | 9/2001 |

OTHER PUBLICATIONS

International Search Report, mailed Sep. 14, 2010, for corresponding International Patent Application No. PCT/JP2010/004252.

* cited by examiner

*Primary Examiner* — Que T Le
(74) *Attorney, Agent, or Firm* — McDermott Will & Emery LLP

(57) ABSTRACT

A solid-state imaging device of the present invention is capable of thinning signals for each column. The solid-state imaging device includes: photo diodes, a drain into which charges transferred by first column CCDs are swept-off, and transfer control units each of which is provided to the corresponding first column CCDs, and transfers, to a row CCD and to the drain, the charges transferred by the corresponding first column CCDs. Each of the transfer control units includes: a second column CCD which transfers, in a column direction, the charges transferred by the first column CCDs corresponding to the transfer control unit, and a column CCD terminal gate which is provided between the second column CCD and the row CCD, and forms a potential barrier between the second column CCD and the row CCD.

21 Claims, 21 Drawing Sheets

Barrier formed at drain gate
No charges swept-off into drain

Transfer charges to row CCD
Change φVDG from Middle to Low such that empty packet is swept-off into drain Barrier formed at Column CCD terminal gate
Charges not transferred toward row CCD Barrier formed at Column CCD terminal gate
Charges not transferred toward row CCD Sweep-off charges into drain

SOLID-STATE IMAGING DEVICE AND DRIVING METHOD OF SOLID-STATE IMAGING DEVICE

CROSS REFERENCE TO RELATED APPLICATIONS

This is a continuation application of PCT Patent Application No. PCT/JP2010/004252 filed on Jun. 28, 2010, designating the United States of America, which is based on and claims priority of Japanese Patent Applications No. 2009-164252 filed on Jul. 10, 2009, and No. 2010-076125 filed on Mar. 29, 2010. The entire disclosures of the above-identified applications, including the specifications, drawings and claims are incorporated herein by reference in their entirety.

BACKGROUND OF THE INVENTION (1) Field of the Invention

The present invention relates to charge coupled device (CCD) solid-state imaging devices and driving methods of the CCD solid-state imaging devices and, in particular, to a technique of transferring charges in a column direction.

(2) Description of the Related Art

Recent solid-state imaging devices have achieved high pixel density of 10 million pixels or more, which allows a user to capture a moving image, and a still image as clear as a photo based on silver photography. As the pixel density becomes higher, a pitch of a unit pixel size of a solid-state imaging device becomes smaller than 2 μm, which makes the unit pixel size even finer. Described hereinafter are a structure of a conventional solid-state imaging device and a driving method of the solid-state imaging device (See Patent Reference 1: Japanese Unexamined Patent Application Publication No. 62-076764, for example) with reference to a charge-transfer (CCD) solid-state imaging device.

FIG. 24 shows a schematic block diagram of a conventional CCD solid-state imaging device.

The solid-state imaging device includes photo diodes 902 arranged two-dimensionally (in a matrix), column CCDs 903 for transferring signal charges (pixel signals) read out from the photo diodes 902, an address circuit 904 which selects, per row, the photo diodes 902 for the reading out, and drains 915 formed separately from the column CCDs 903. Transfer of the charges to the drains 915 is controlled by a transfer pulse applied to transfer electrodes 905 and 906, and control gates (drain gate) 914. The transfer electrodes 905, 906, and the control gate 914 are respectively formed in rows (lines), and connected to terminals 918, 919, and 916 with a separate line.

In such a solid-state imaging device, the signal charges, transferred by the column CCDs 903, are transferred from an end of the column CCDs 903 to a row CCD 911 by the transfer electrodes 905 and 906. Concurrently, smear charges are swept from the column CCDs 903 to the drains 915 by the transfer electrodes 905 and the control gates 914. The transfer electrodes 905, 906, and the control gates 914 are connected with a separate line. Thus, for an image, the above sequence of operations is typically controlled per row.

SUMMARY OF THE INVENTION

In the conventional solid-state imaging device and the driving method of the solid-state imaging device, as described above, one drain gate is provided to a corresponding one of the column CCDs. The drain gates in a row have the same driving pulse applied to. Thus, the conventional solid-state imaging device and the technique can sweep-off smear charges and unnecessary packets on a row basis, but cannot on a column basis.

Recent solid-state imaging devices include a significantly large number of pixels; however, such devices develop a problem of a lower frame rate since the read-out speed of the signal charges cannot catch up with the increasing number of the pixels. A Typical counter measure to the lowering frame rate is compression of the number of output packets by thinning and adding the pixel signals. The addition of the pixel signals is easily achieved by (i) selective reading-out of the signal charges from a photo diode to a column CCD and (ii) adjusting a driving pulse to be applied to the column CCD and a row CCD. This approach, however, reduces a dynamic range. The thinning of the pixel signals in a column direction (thinning in a column direction) is easily achieved by (i) selective reading-out of the signal charges from a photo diode to a column CCD and (ii) an electronic shutter which sweeps off, to the substrate, signal charges not to be read-out. This approach, however, develops deterioration in image quality such as jaggies on the outline of a subject in an output image and significantly uneven resolution between row and column. Thus, in many cases, the compression of the output signals (the number of output signals) is achieved by the combination of adding and thinning the pixel signals. For further improvement in image quality, required is a technique to thin signals for each column having photo diodes.

On the other hand, finer unit pixels in a solid-state imaging device make it difficult to prevent unnecessary charges, such as smears and bloom, from developing in column CCDs. To overcome such a problem, required are counter measures based on the structures and the driving of the column CCDs. In particular, one of the serious challenges is to devise a countermeasure to deterioration in image quality caused by the development of the smears and blooming charges overflowing the column CCDs into the row CCD when the capturing object is a light source having a significant amount of light.

Hence, the first object of the present invention is to provide a solid-state imaging device capable of thinning signals on a column basis, and a driving method of the solid-state imaging device.

The second object of the present invention is to provide a solid-state imaging device capable of curbing the deterioration of image quality caused by a smear and bloom, and a driving method of the solid-state imaging device.

In order to achieve the above objects, a solid-state imaging device of the present invention includes: photo diodes which are arranged two-dimensionally; first column charge coupled devices (CCDs) each of which is provided to a corresponding one of columns of the photo diodes, reads charges from the photo diodes provided to the corresponding column, and transfers the charges in a column direction; a row CCD which transfers, in a row direction, part of the charges transferred by the first column CCDs; a drain into which the rest of the charges transferred by the first column CCDs are swept-off; and transfer control units each of which is provided to corresponding the first column CCDs, and transfers, to the row CCD and to the drain, the charges transferred by the corresponding first column CCDs, wherein each of the transfer control units includes: a second column CCD which transfers, in a column direction, the charges transferred by the first column CCDs corresponding to the transfer control unit; and a column CCD terminal gate which is provided between the second column CCD and the row CCD, and forms a potential barrier between the second column CCD and the row CCD.

This structure allows the transfer control units to (i) transfer, to the row CCD, the signal charges of the photo diodes provided to a predetermined column and (ii) transfer, to the drain, the signal charges of photo diodes provided to columns other than the predetermined column. Thus, signals can be thinned for each column. As a result, the solid-state imaging device can achieve a higher frame rate as well as secure the dynamic range and reduce the image quality deterioration, even though finer and more pixels are used.

Furthermore, the potential barrier is formed between the second column CCD and the row CCD when no signal charges are transferred to the row CCD. This feature curbs the overflow of smears and blooming charges out of the column CCDs into the row CCD. As a result, the deterioration of image quality due to the smears and the blooming can be reduced.

During a row scanning period, each of the transfer control units may transfer the charges of the second column CCD to the drain, with the potential barrier formed between the column CCD and the row CCD.

This feature reduces the overflow of the charges out of the column CCDs into the row CCD during the row scanning period, followed by the development of abnormality on an image.

Furthermore, the first column CCDs, the transfer control units, and the row CCD may transfer packets including charges to be transferred by successive potential wells separated by potential barriers, and each of the transfer control units may selectively transfer (i) to the row CCD, a packet included in the packets and having signal charges, and (ii) to the drain, a packet included in the packets and not having the signal charges.

This feature allows the packet including unnecessary charges to be swept-off into the drain in the solid-state imaging device, which contributes to reducing smear charges in an output signal, and developing fewer smears.

As described above, the solid-state imaging device and the driving method of the solid-state imaging device of the present invention is capable of thinning pixel signals on a column basis. This feature narrows the difference of the thinning rates of the pixel signals between the column direction and the row direction, and provides uniformed centers of gravity for additional pixels. The uniformity contributes to reducing non-uniformity of the resolution in the column direction and the row direction, and providing the object of capturing a smoother outline. Furthermore, the solid-state imaging device and the driving method bring improvement in pixel compression to achieve a higher frame rate. Moreover, the solid-state imaging device and the driving method can thin more pixel signals to reduce the number of additions of pixel signals. This feature contributes to improvement in dynamic range.

In addition, the solid-state imaging device and the driving method sweep-off packets having unnecessary charges to reduce smears in an image. Furthermore, the solid-state imaging device and the driving method keep overflowing charges from flowing into a row CCD during a row scanning period, and prevent an abnormality in an image.

The above features successfully optimize the characteristics of a solid-state imaging device. Since solid-state imaging devices today are having more pixels and going finer, the present invention has highly practical value.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

Embodiments of the present invention are described hereinafter, with reference to the drawings.

(Embodiment 1)

Figure 1:
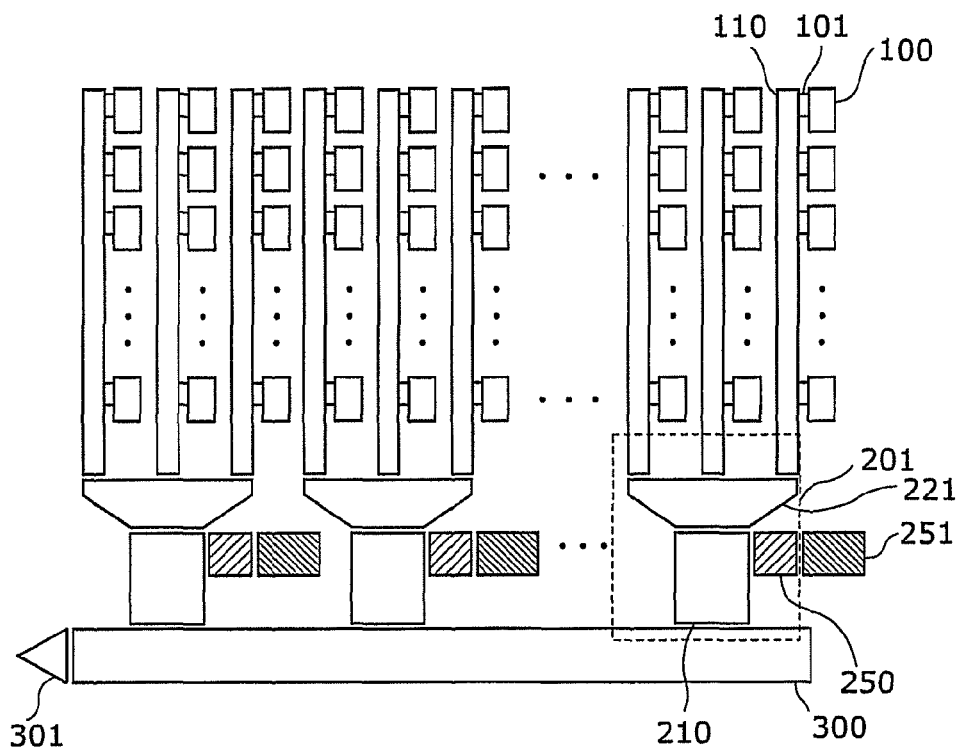
FIG. 1 shows a structure of a solid-state imaging device according to Embodiment 1 of the present invention.

FIG. 1 shows a structure of a solid-state imaging device according to Embodiment 1.

As shown in FIG. 1, the solid-state imaging device includes: photo diodes 100 arranged two-dimensionally and working as photoelectric converting units, read-out units 101, first column CCDs 110 working as shift registers, transfer control units 201, drains 251, a row CCD 300 working as a shift register, and a signal outputting unit 301.

Each of the first column CCDs 110 is provided to a corresponding one of columns of the photo diodes 100, reads signal charges from the corresponding column of the photo diodes 100, and transfers the read signal charges in a column direction. Each of the first column CCDs 110 has a column CCD gate electrode (not shown).

The charges transferred by the first column CCDs 110 are swept-off to each of the drains 251.

The row CCD 300 transfers, in a row direction, part of the charges transferred by the first column CCDs 110. The row CCD 300 has a row CCD gate electrode (not shown).

Each of the transfer control units 201 is provided to corresponding two or more of the first column CCDs 110. The transfer control unit 201 transfers, to the row CCD 300 and the drain 251, the charges transferred by the corresponding first column CCDs 110. The transfer control unit 201 includes a second column CCD 210, a junction unit 221, a drain gate 250, and a column CCD terminal gate (not shown). In the transfer control unit 201, the first column CCDs 110 merge at the junction unit 221.

The second column CCD 210 transfers some other charges (charges not to be transferred to the row CCD 300) in a column direction. Here, the charges are transferred by the first column CCDs 110 corresponding to the transfer control unit 201 having the second column CCD 210.

The column CCD terminal gate is provided between the second column CCD 210 and the row CCD 300, and forms a potential barrier therebetween. The column CCD terminal gate controls the charge transfer observed between the second column CCD 210 and the row CCD 300. The column CCD terminal gate is formed of a gate electrode and a channel region provided below the gate electrode.

The drain gate 250 is provided between the second column CCD 210 and the drain 251, and forms a potential barrier therebetween. The drain gate 250 controls the charge transfer observed between the second column CCD 210 and the drain 251. The drain gate 250 is formed of a gate electrode and a channel region provided below the gate electrode.

The junction unit 221 is provided between the second column CCD 210 and the first column CCDs 110 corresponding to the transfer control unit 201 having the junction unit 221. The junction unit 221 transfers, to the second column CCD 210, the charges transferred by the first column CCDs 110.

The first column CCDs 110, the transfer control unit 201, and the row CCD 300 transfer packets. The packets are the charges to be transferred by successive potential wells separated by potential barriers.

In the above-structured solid-state imaging device, the photo diodes 100 convert light into electric charges, and generate signal charges for the amount of incident light. The generated signal charges are read out from the read-out units 101 to the first column CCDs 110 by a read-out pulse applied to the column CCD gate electrodes also working as read-out gates. The read-out signal charges are transferred as the signal charge packets through the first column CCDs 110 in a column direction by the column transfer pulse applied to the column CCD gate electrodes. The read-out signal charges are further transferred through the junction unit 221 and the second column CCD 210 in a column direction, and flows into the row CCD 300. The flowing signal charge packets are transferred through the row CCD 300 in a row direction by a row transfer pulse applied to the row CCD gate electrode. Then, the signal charges arrive at the signal outputting unit 301. Upon arriving at the signal outputting unit 301, the signal charge packets are converted into voltage signals by the signal outputting unit 301. After the voltage signals are detected, the signal charge packets are swept-off to a reset drain unit (not shown).

Meanwhile, part of the signal charge packets from the second column CCD 210 are not transferred to the row CCD 300, and swept-off. Such signal charge packets flow from the junction unit 221 through the second column CCD 210 and the drain gate 250, and swept-off to the drain 251.

A driving pulse (such as a read-out pulse, a column transfer pulse, and a row transfer pulse) for read-out from the photo diodes 100, column transfer, row transfer, and sweep-off of the signal charges is applied by the driving pulse controlling unit (not shown) provided outside the solid-state imaging device.

The drain 251 can be formed by such techniques as: externally applying a high voltage (10V, for example) to drain forming portion of the substrate on which the solid-state imaging device is formed, and removing a barrier by an impurity between the drain forming portion and deep part of the substrate. In highly finer solid-state imaging devices today, it is difficult to form the structure of the drain 251 in terms of processing accuracy. In the case of the structure of the drain having a high voltage applied to, the development of breakdown and punchthrough would be a problem.

The solid-state imaging device according to Embodiment 1, however, has column CCDs including the first column CCD 110s and the second column CCDs 210. In the column CCDs, two or more of the first column CCDs 110 are merged at the junction unit 221 and connected to one of the second column CCDs 210. Since this structure can leave a space between the neighboring column CCDs in the second column CCD 210, a drain structure can be formed in the spaced portion. This makes it is easy to form the drain structure.

Using the after-described driving technique, the solid-state imaging device according to Embodiment 1 successfully (i) thins output images on a column basis (ii) reduces smears and (iii) prevents an abnormality in an image caused by the signal charges overflowing the column CCDs into the row CCD during a row scanning period. When the packets are not transferred to the row CCD 300, for example, the solid-state imaging device causes the transfer control unit 201 to form a potential barrier between the first column CCDs 110 and the row CCD 300 to avoid the overflow.

EXAMPLE 1

Example 1 shows an application of the solid-state imaging device according to Embodiment 1.

Figure 2A:
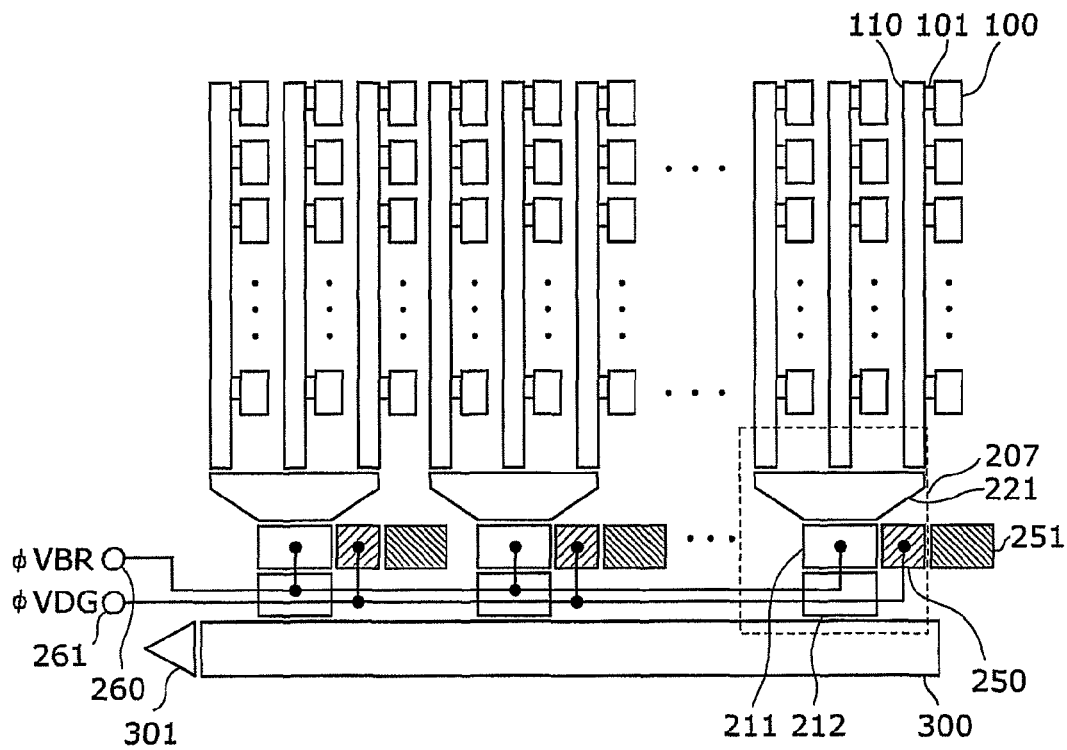
FIG. 2A shows a structure of a solid-state imaging device according to Example 1 in Embodiment 1.
Figure 2B:
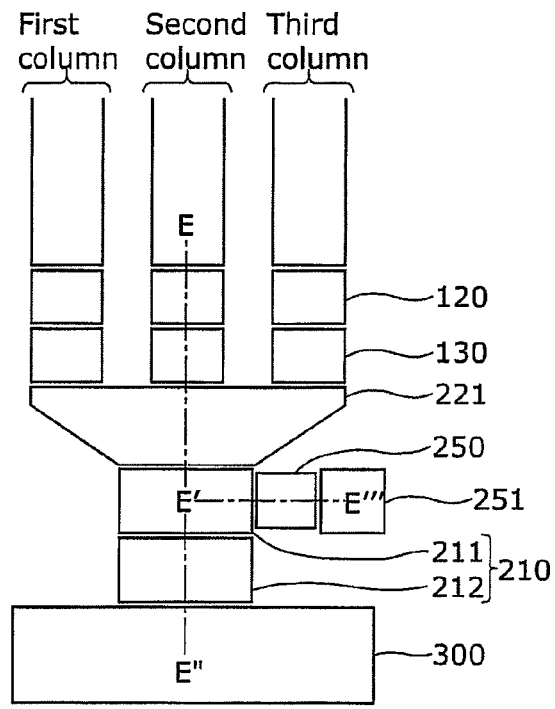
FIG. 2B shows structures of a transfer control unit and a drain according to Example 1.

FIG. 2A shows a structure of the solid-state imaging device according to Example 1, and FIG. 2B shows structures of a transfer control unit 207 and the drain 251.

As shown in FIG. 2A, the solid-state imaging device includes: the photo diodes 100, the read-out units 101, the first column CCDs 110, the transfer control units 207, the drains 251, the row CCD 300, and the signal outputting unit 301.

As shown in FIG. 2B, the transfer control unit 207 includes: a storage gate 120, a hold gate 130, the second column CCD 210, the junction unit 221, and the drain gate 250. The second column CCD 210 includes a splitting unit 211 and a column CCD terminal gate 212. In each of the transfer control units 207, three of the first column CCDs 110 are merged at the junction unit 221. The three first column CCDs 110 correspond to three of the columns of the photo diodes 100.

Each of hold gates 130 is provided to correspond to one of the first column CCDs 110 which are provided in association with the transfer control unit 207 including the hold gate 130 itself. The hold gate 130 forms a potential barrier between the corresponding first column CCD 110 and the junction unit 221. The hold gate 130 is formed of a gate electrode and a channel region provided below the gate electrode.

The column CCD terminal gate 212 is provided between the second column CCD 210 and the row CCD 300, and forms a potential barrier therebetween. The column CCD terminal gate 212 controls the charge transfer observed between the second column CCD 210 and the row CCD 300. The column CCD terminal gate 212 is formed of a gate electrode and a channel region provided below the gate electrode.

A driving pulse is supplied from the first column CCDs 110 to the storage gates 120 and the hold gates 130 in order to control the transfer of the charges to the junction unit 221. Provided between the first column of the three merging first column CCDs 110 and the junction unit 221, the storage gate 120 and the hold gate 130 have driving pulses φVSTL and φVHLTD respectively supplied to. Driving pulses φVSTC and φVHLDC are respectively supplied to the storage gate 120 and the hold gate 130 both provided between the second column of the three merging first column CCDs 110 and the junction unit 221. Driving pulses φVSTR and φVHLDR y are respectively supplied to the storage gate 120 and the hold gate 130 both provided between the third column of the three merging first column CCDs 110 and the junction unit 221.

Driving pulses φVJC, φVBR, φVL, and φVDG are respectively supplied to the junction unit 221, the splitting unit 211, the column CCD terminal gate 212, and the drain gate 250. According to the supplied driving pulses, each of the splitting units 211 and the drain gates 250 controls transfer of the charges from the second column CCD 210 to the drain 251.

The column transfer pulse φVx is supplied to the first column CCDs 110. Row transfer pulses φH1 and φH2 are supplied to the row CCD 300.

The splitting units 211 for all of the transfer control units 207 are connected to a terminal 260 to which the driving a pulse φVBR are supplied. Thus, all of the splitting units 211 arranged in a row are controlled by a driving pulse in a single system.

The drain gates 250 for all of the transfer control units 207 are connected to a terminal 261 to which the driving pulse φVDG is supplied. The column CCD terminal gates 212 for all of the transfer control units 207 are connected to a terminal to which the driving pulse φVL is supplied for driving the column CCD terminal gates 212. Hence, arranged in a row, the drain gates 250 and the column CCD terminal gates 212 each are controlled by a driving pulse in a single system.

Each of the transfer control units 207 selectively transfers, to the row CCD 300, a packet transferred by a predetermined one of the first column CCDs 110 which correspond to the transfer control unit 207 itself. The transfer control unit 207 selectively transfers, to the drain 251, packets transferred by another one of the first column CCDs which is different from the predetermined first column CCD. Here the first column CCDs correspond to the transfer control unit.

Described next is how signal charge packets, transferred through the first column CCDs 110, are (i) transferred to the signal outputting unit 301, and (ii) swept-off into the drain 251 by the transfer control unit 201 (driving technique), with reference to FIGS. 3A to 3E. It is noted that described below is how to sweep-off the signal charge packets in the second column among the merging three first column CCDs 110, and how to mix the signal charge packets in the first and the third columns and to transfer the mixed packets to the signal outputting unit 301.

Figure 3A:
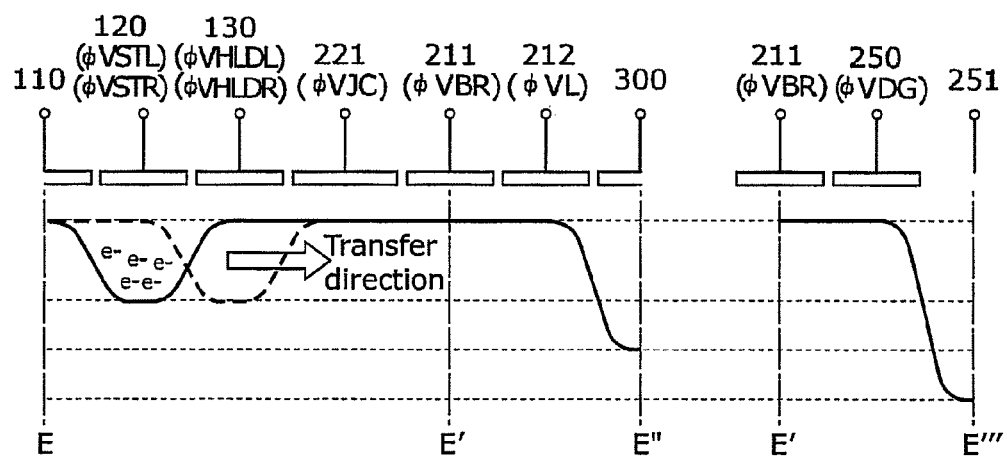
FIG. 3A shows potential distribution (potential distribution in E-E'-E" and E'-E'" in FIG. 2B) in charge transfer by the transfer control unit according to Example 1 immediately after a row scanning.
Figure 3B:
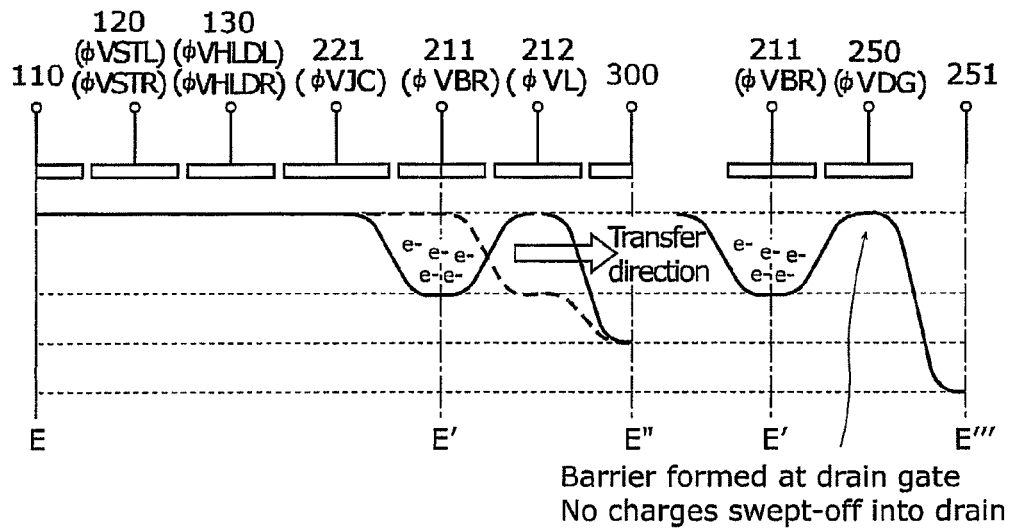
FIG. 3B shows potential distribution (potential distribution in E-E'-E" and E'-E'" in FIG. 2B) in the charge transfer by the transfer control unit according to Example 1 during a row blanking interval.
Figure 3C:
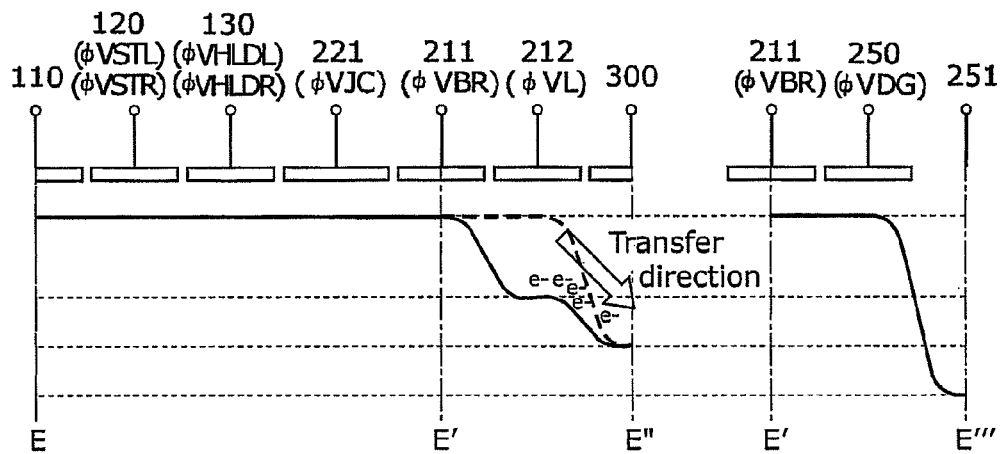
FIG. 3C shows potential distribution (potential distribution in E-E'-E" and E'-E'" in FIG. 2B) in the charge transfer by the transfer control unit according to Example 1 during the row blanking interval.
Figure 3D:
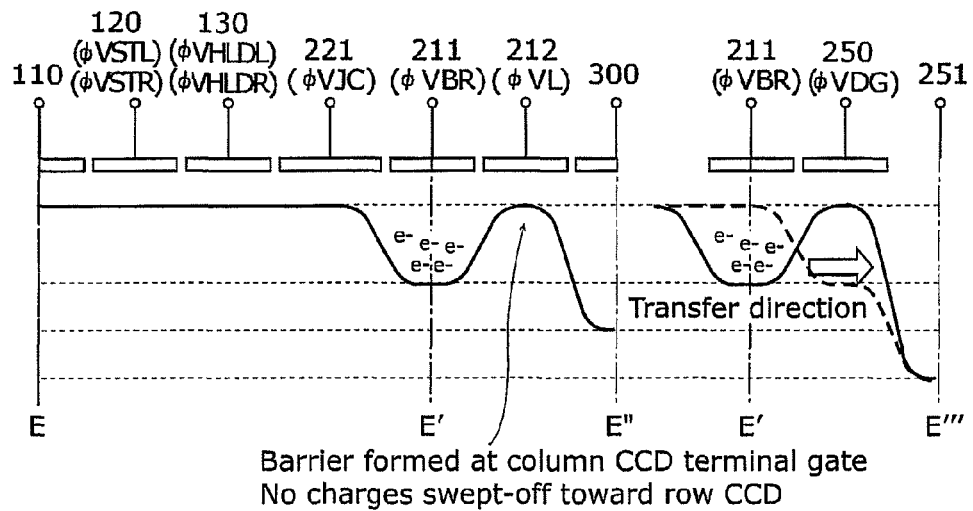
FIG. 3D shows potential distribution (potential distribution in E-E'-E" and E'-E'" in FIG. 2B) in sweeping-off of signal charge packets by the transfer control unit according to Example 1.
Figure 3E:
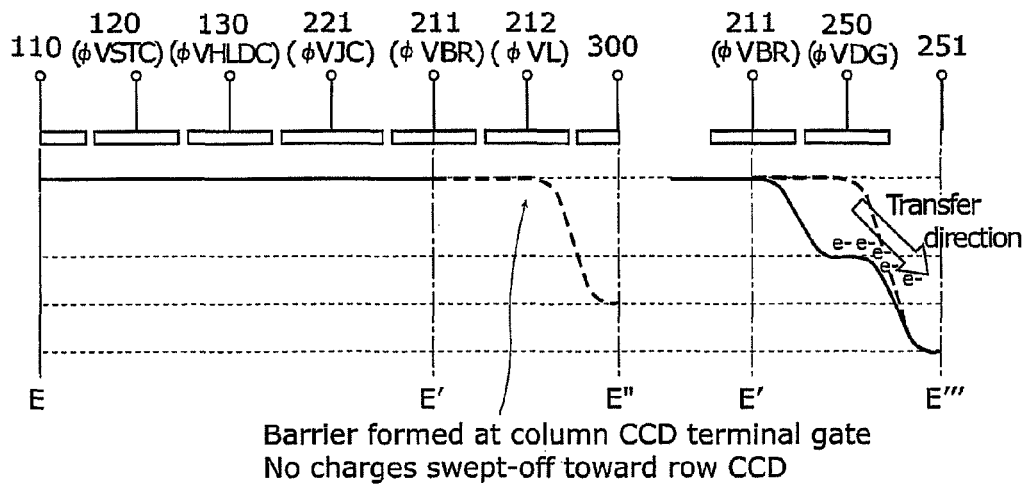
FIG. 3E shows potential distribution (potential distribution in E-E'-E" and E'-E'" in FIG. 2B) in the sweeping-off of the signal charge packets by the transfer control unit according to Example 1.
Figure 4:
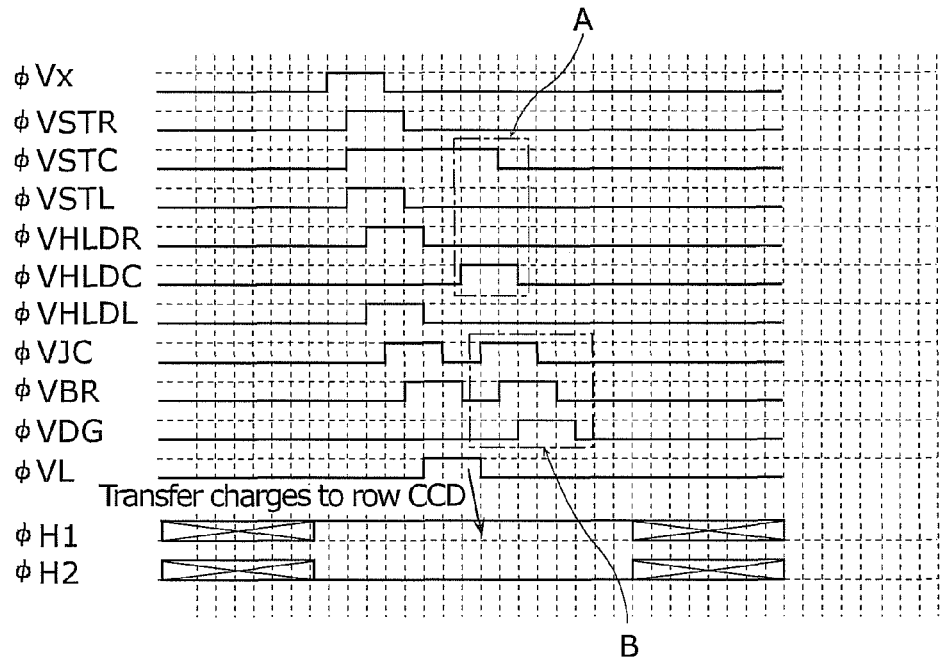
FIG. 4 shows a timing diagram showing an operation of the transfer control unit according to Example 1.

FIGS. 3A to 3E show potential distribution (potential distribution in E-E'-E''' and E'-E''' in FIG. 2B) in the transfer control unit 201. FIG. 4 shows a timing diagram showing an operation of the transfer control unit 201. It is noted that A in FIG. 4 shows the case where the charges in the second column among three of the column CCDs are not transferred to the row CCD, but are held in the transfer control unit. B in FIG. 4 shows the case where the charges found in the second column and held in the transfer control unit are swept-off into the drain.

Described first is an operation of the transfer control unit 201 when the signal charge packets are transferred to the signal outputting unit 301.

First, the Middle level voltages φVSTL and φVSTR are supplied to the storage gates 120, and the Low level voltages φVHLDL and φVHLDR are supplied to the hold gates 130. Here, each of the storage gates 120 and the hold gates 130 is provided in association with the first and the third columns among the three merging first column CCDs 110. This causes the storage gates 120 and the hold gates 130 in the first and the third columns to be respectively set to the Middle level voltage and to the Low level voltage. Accordingly, the signal charges in the first and the third columns are accumulated in the storage gates 120 (FIG. 3A).

Then, the Low level voltages φVSTL and φVSTR are supplied to the storage gates 120, and the Middle level voltages φVHLDL and φVHLDR are supplied to the hold gates 130. Here, each of the storage gates 120 and the hold gates 130 is provided in association with the first and the third columns among the first column CCDs 110. This causes the hold gates 130 in the first and the third columns to be selectively set to the Middle level voltages. Accordingly, the signal charges accumulated in the storage gates 120 are transferred to the hold gates 130.

Next, the Low level voltages φVHLDL and φVHLDR are supplied to the hold gates 130 provided in association with the first and the third columns among the first column CCDs 110, and the Middle level voltage φVJC is supplied to the junction unit 221. Then, the Middle level voltage φVJC is supplied to the splitting unit 211, and the Low level voltage φVJC is supplied to the junction unit 221. Furthermore, the Middle level voltage φVL is supplied to the column CCD terminal gate 212, and the Low level voltage φVBR is supplied to the splitting unit 211. This causes the junction unit 221, the splitting unit 211, and the column CCD terminal gate 212 to be sequentially set to the Middle level voltages. Accordingly, the signal charge packets in the first and the third columns among the first CCDs 110 are mixed, and the mixed signal charge packets are transferred to the row CCD 300 (FIGS. 3B and 3C).

Finally, once transferred to the row CCD 300, the signal charge packets are transferred through the row CCD 300 and outputted at the signal outputting unit 301.

Described next is an operation of the transfer control unit 201 when signal charge packets are swept-off into the drain 251.

First, the Middle level voltage VSTC and the Low level voltage φVHLDC are respectively supplied to the storage gate 120 and the hold gate 130 both provided in association with the second column among the merging three first column CCDs 110. This causes the signal charge packets in the second column of the first column CCDs 110 to be accumulated in the storage gate 120.

Next, the Low level voltage φVSTC and the Middle level voltage φVHLDC are respectively supplied to the storage gate 120 and the hold gate 130 both provided in association with the second column among the first column CCDs 110. This causes the signal charge packets, accumulated in the storage gate 120 on the second column, to be transferred to the hold gate 130.

Then, the Low level voltages φVHLDL is supplied to the hold gate 130 provided in association with the second column among the first column CCDs 110, and the Middle level voltage φVJC is supplied to the junction unit 221. This causes the signal charge packets in the second column among the first column CCDs 110 to be transferred to the junction unit 221.

Next, the Middle level voltage φVBR is supplied to the splitting unit 211. The Low level voltage φVL is supplied to the column CCD terminal gate 212. The Low level voltage φVDG is supplied to the drain gate 250. This causes the signal charge packets in the second column among the first column CCDs 110 to be accumulated in the splitting unit 211 (FIG. 3D).

Finally, the Low level voltage φVBR is supplied to the splitting unit 211, and the Middle level voltage φVDG is supplied to the drain gate 250. This causes the signal charge packets in the second column among the first column CCDs 110 are selectively swept-off in the drain 251 (FIG. 3E).

As described above, the solid-state imaging device according to Example 1 can selectively control the transfer of the signal charges for each column of the photo diodes 100, and sets a column for outputting signals (outputting an image) and a column for sweeping (thinning) signals. Accordingly, the solid-state imaging device can thin images in a row direction.

EXAMPLE 2

Structured as shown in FIG. 2A, a solid-state imaging device according to Example 2 includes: the photo diodes 100, the read-out units 101, the first column CCDs 110, the transfer control units 207, the drains 251, the row CCD 300, and the signal outputting unit 301. Structured as shown in FIG. 2B, each of the transfer control units 207 includes: the storage gate 120, the hold gate 130, the second column CCD 210, the junction unit 221, and the drain gate 250. The second column CCD 210 includes the splitting unit 211 and the column CCD terminal gate 212.

During a row scanning period, the transfer control unit 207 transfers the charges in the second column CCD 210 to the drain 251, with a potential barrier formed between the second column CCD 210 and the row CCD 300.

Described next is a driving technique of the transfer control unit 207 during the row scanning period.

Figure 5:
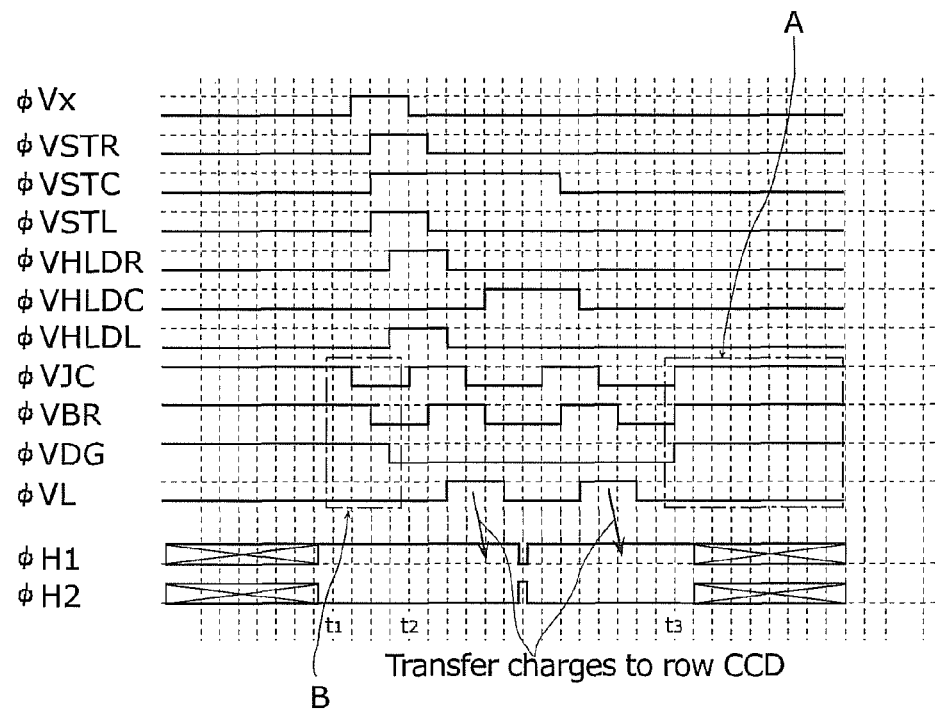
FIG. 5 shows a timing diagram showing an operation of a transfer control unit according to Example 2 in Embodiment 1.

FIG. 5 shows a timing diagram showing an operation of the transfer control unit 207. It is noted that A in FIG. 5 shows the case where the gage leading to the drain is set to the Middle level voltage to prevent VCCD overflow charges in the row scanning period from flowing into the row CCD. B in FIG. 5 shows the case where φVDG is changed from the Middle level to the Low level such that the VCCD overflow charges in the row scanning period and the charges in an empty packet are swept-off into the drain.

The operation in FIG. 5 differs from that in FIG. 4 in that the operation in FIG. 5 involves supplying at t3 after the column transfer in the row blanking interval finishes (i) the Middle level voltage φVJC to the junction unit 221 (ii) the Middle level voltage φVBR to the splitting unit 211 and (iii) the Middle level voltage φVDG to the drain gate 250. This operation causes the junction unit 221, the splitting unit 211, and the drain gate 250 to be set to the Middle level voltage, and causes the column CCD terminal gate 212 to be kept set to the Low level voltage throughout the row scanning period. As a result, even though unnecessary charges develop in the first column CCDs 110 and increase to the point of overflowing a barrier gate, the unnecessary charges do not flow toward the row CCD 300 from the splitting unit 211. Instead, the unnecessary charges move through the drain gate 250 and flows into the drain 251.

Because of various reasons for driving techniques, not all of the junction unit 221, the splitting unit 211, and the drain gate 250 have to be set to the Middle level voltage at t3. For example, the junction unit 221 may be set to the Low level voltage. Furthermore, at t3, the column CCD terminal gate 212 may be set to the Middle level voltage instead of to the Low level voltage.

Moreover, in the t1 to t2 period after the row scanning period ends, the operation in FIG. 5 differs from that in FIG. 4 as follows: the Low level voltage φVBR is supplied to the splitting unit 211 after the Low level voltage φVJC is supplied to the junction unit 221, and the Low level voltage VDG is supplied to the drain gate 250 after the Low level voltage φVBR is supplied to the splitting unit 211. This operation sequentially turns the junction unit 221, the splitting unit 211, and the drain gate 250 from the Middle level to the Low level. As a result, the charges in the junction unit 221, the splitting unit 211, and the drain gate 250 are completely swept-off into the drain 251.

As described above, the solid-state imaging device according to Example 2 successfully curbs the increase in the unnecessary charges, such as smears and bloom developed in the first column CCDs 110 during the row scanning period, and prevents the unnecessary charges from overflowing the barrier gate of the first column CCDs 110 into the row CCD 300. As a result, the solid-state imaging device can keep an abnormality in an image caused by smears and bloom from affecting a neighboring column and the entire image.

EXAMPLE 3

A solid-state imaging device according to Example 3 is structured as shown in FIG. 2A. The solid-state imaging device includes: the photo diodes 100, the read-out units 101, the first column CCDs 110, the transfer control units 207, the drains 251, the row CCD 300, and the signal outputting unit 301. Structured as shown in FIG. 2B, each of the transfer control units 207 includes: the storage gate 120, the hold gate 130, the second column CCD 210, the junction unit 221, and the drain gate 250. The second column CCD 210 includes the splitting unit 211 and the column CCD terminal gate 212.

The transfer control unit 207 selectively transfers (i) to the row CCD 300, a signal charge packet including signal charges and unnecessary charges such as smears and noise and (ii) to a corresponding one of the drains 251, an empty packet including not the signal charges but only the unnecessary charges such as smears, bloom, and noise.

Described next is a driving technique of the transfer control unit 207 for sweeping-off the empty packet into the drain 251.

Figure 6A:
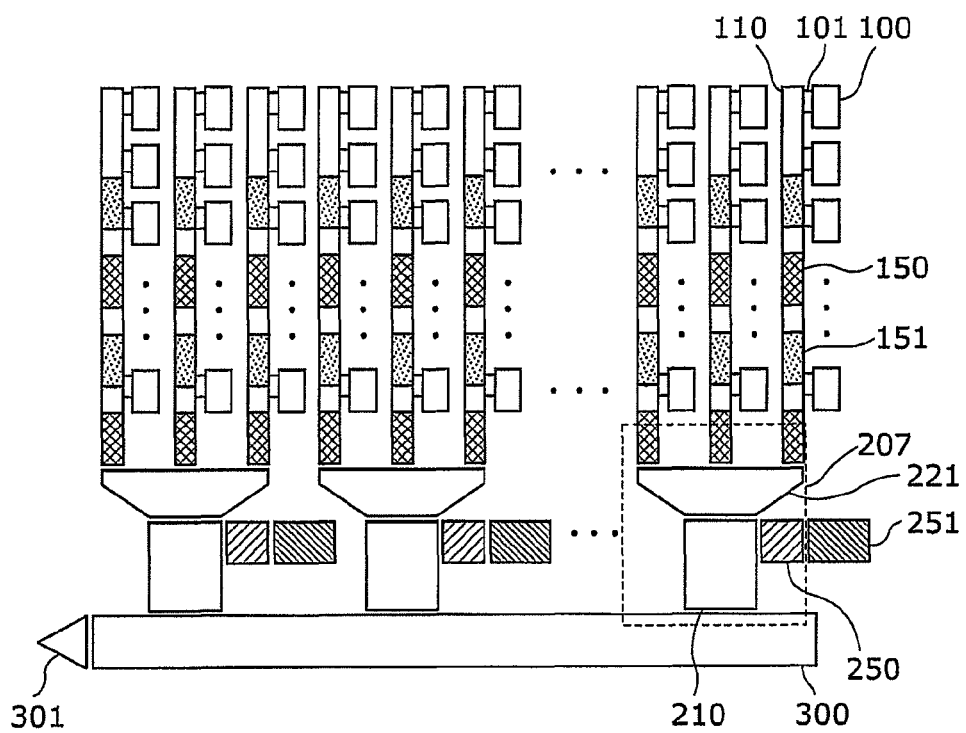
FIG. 6A shows how signal charge packets and empty packets are being transferred in a solid-state imaging device according to Example 3 in Embodiment 1.
Figure 6B:
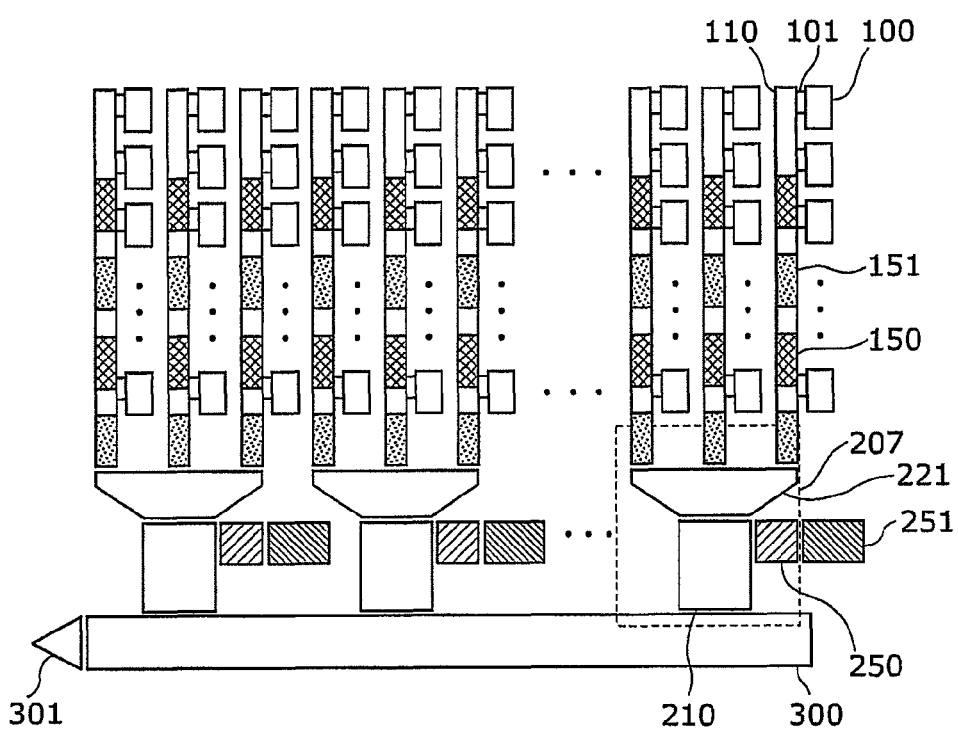
FIG. 6B shows how the signal charge packets and the empty packets are being transferred in the solid-state imaging device according to Example 3 in Embodiment 1.

FIGS. 6A and 6B show how a signal charge packet 150 and an empty packet 151 are transferred.

As soon as the row scanning period moves to the row blanking interval, as shown in FIG. 6A, each of the first column CCDs 110 alternately has the signal charge packet 150 and the empty packet 151 aligned in a column. As soon as the row scanning period moves to the row blanking interval, the signal charge packet 150 waits at the storage gate 120 provided at the end of the first column CCD 110.

In the state shown in FIG. 6A, the hold gate 130 is selectively set to the Middle level voltage. Furthermore, the junction unit 221, the splitting unit 211, and the column CCD terminal gate 212 are also sequentially set to the Middle level voltage. Then, the storage gate 120, the hold gate 130, the junction unit 221, the splitting unit 211, and the column CCD terminal gate 212 are sequentially set to the Low level voltage, and the signal charge packet 150 is transferred to the row CCD 300. This operation is carried out in each of the transfer control units 207. Then, the signal charge packet 150 in each of the columns is transmitted to the row CCD 300, resulting in the state shown in FIG. 6B.

In the state shown in FIG. 6B, all the hold gates 130 is set to the Middle level voltage. Furthermore, the junction unit 221, the splitting unit 211, and the drain gate 250 are also sequentially set to the Middle level voltage. Then, the storage gate 120, the hold gate 130, the junction unit 221, the splitting unit 211, and the drain gate 250 are sequentially set to the Low level voltage. The empty packet 151, waiting at the storage gate 120 provided at the end of the first column CCD 110, is swept-off into the drain 251.

Figure 7:
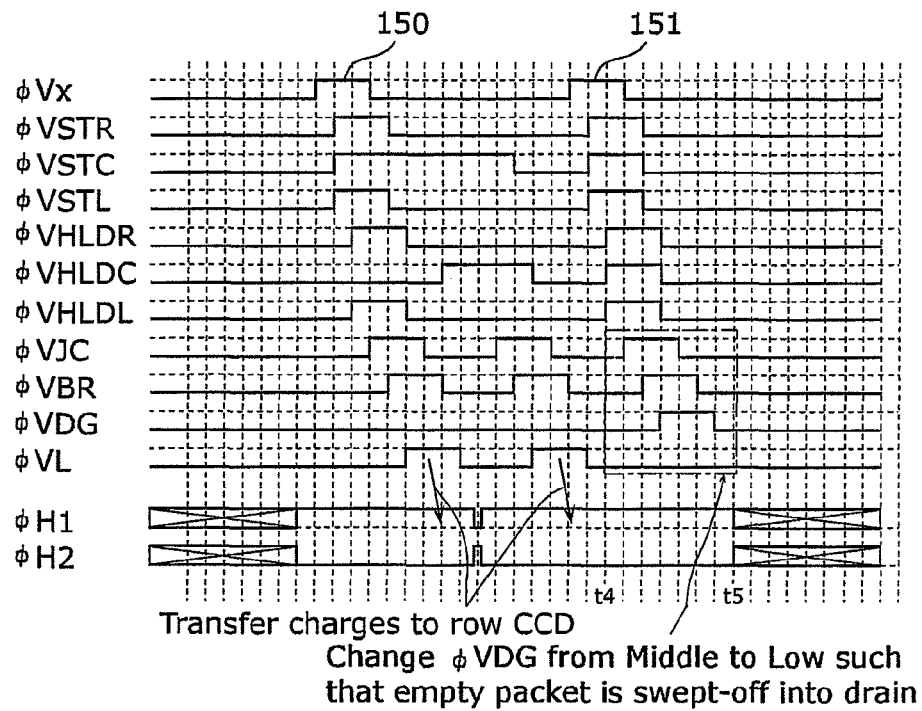
FIG. 7 shows a timing diagram showing an operation of the transfer control unit according to Example 3.

FIG. 7 depicts a timing diagram showing the operation of the transfer control unit 207 (the operation in FIGS. 6A and 6B).

The operation in FIG. 7 differs from that in FIG. 4 as follows: In the t4 to t5 period after the transfer of the signal charge packet 150 to the signal outputting unit 301 and the sweeping-off of the empty packet 151 into the drain 251, the operation in FIG. 7 involves supplying (i) the Low level voltage φVBR to the splitting unit 211 after the Low level voltage φVJC is supplied to the junction unit 221 and (ii) the Low level voltage φVDG is supplied to the drain gate 250 after the Low level voltage φVBR is supplied to the splitting unit 211. This operation sequentially turns the junction unit 221, the splitting unit 211, and the drain gate 250 from the Middle level to the Low level. As a result, the empty packet 151 is swept-off into the drain 251.

As described above, the solid-state imaging device according to Example 3 successfully reduce unnecessary charges developed by smears and bloom, depending on an area rate which the signal charge packet 150 and the empty packet 151 share in the first column CCD 110. For example, a sequence of twelve gates in the first column CCDs 110 is one repetitive unit, including the signal charge packet 150, a barrier, the empty packet 151, and a barrier respectively having four gates, two gates, four gates and two gates. Here, compared with the case where all of the packets are signal-outputted by addition drive, the unnecessary charges can be reduced to half (−6 dB).

EXAMPLE 4

Structured as shown in FIG. 2A, a solid-state imaging device according to Example 4 includes: the photo diodes 100, the read-out units 101, the first column CCDs 110, the transfer control units 207, the drains 251, the row CCD 300, and the signal outputting unit 301. Structured as shown in FIG. 2B, each of the transfer control units 207 includes: the storage gate 120, the hold gate 130, the second column CCD 210, the junction unit 221, and the drain gate 250. The second column CCD 210 includes the splitting unit 211, and the column CCD terminal gate 212.

Each of the transfer control units 207 transfers, to the row CCD 300 as signal charge packets, part of the packets sequentially transferred by a predetermined one of the first column CCDs 110 which correspond to the transfer control unit 207 itself. The transfer control unit 207 also transfers, to a corresponding one of the drains 251, the other sequentially transferred packets as charge packets to-be-thinned.

Described next is how the charge packets to-be-thinned are swept-off into the drain 251 to thin an output image in a row direction.

Figure 8:
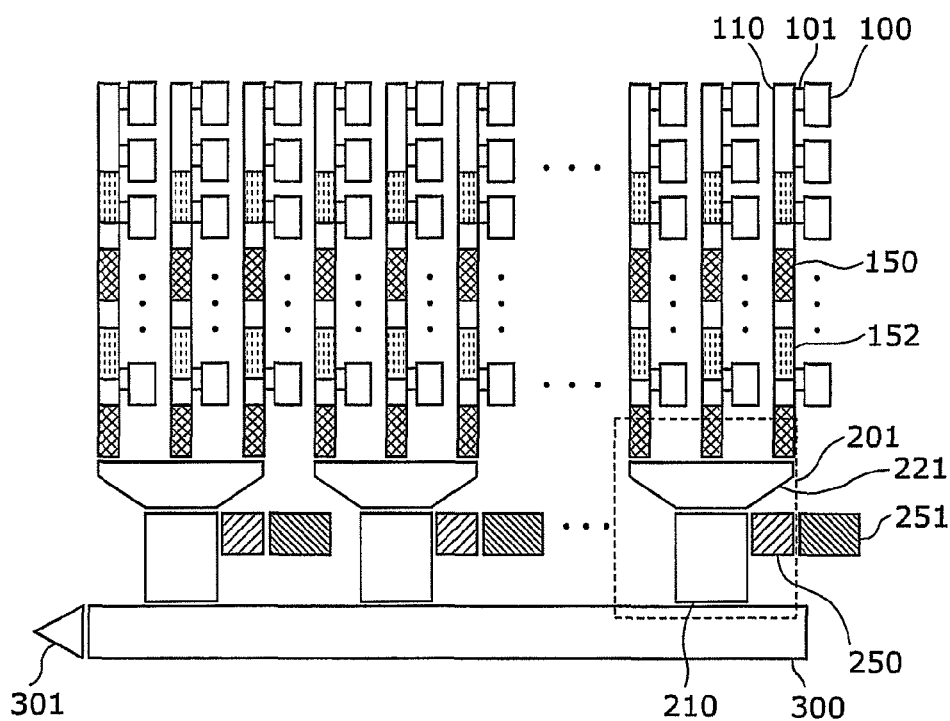
FIG. 8 shows how signal charge packets and charge packets to-be-thinned are being transferred in a solid-state imaging device according to Example 4 in Embodiment 1.

FIG. 8 shows how the signal charge packet 150 and a charge packet to-be-thinned 152 are transferred.

As soon as the row scanning period moves to the row blanking interval, as shown in FIG. 8, each of the first column CCDs 110 alternately has the signal charge packet 150 and charge packet to-be-thinned 152 aligned in a column. Both of the signal charge packet 150 and the charge packet to-be-thinned 152 include the signal charges read out from the photo diodes 100.

In the state in FIG. 8, the transfer control unit 207 carries out an operation similar to that of sweeping-off the empty packet 151 into the drain 251; that is, the operation shown in FIGS. 6A to 7 which handles the charge packet to-be-thinned 152 instead of the empty packet 151. Then, the charge packet to-be-thinned 152 swept-off into the drain 251.

As described above, the solid-state imaging device according to Example 4 successfully sweeps off the charge packet to-be-thinned 152 into the drain 251 to thin an output image in a column direction. A typical thinning of pixel signals in a column direction is carried out by selectively reading out the signal charges from the photo diodes 100. Thus, the number of systems for a read-out gate provided to each of the first column CCDs 110 need to be increased, depending on combinations of read-out patterns (the kind of a driving technique). The solid-state imaging device according to Example 4, however, is capable of thinning pixel signals in a column direction by simply changing the period of a driving pulse supplied to the transfer control unit 207. This feature contributes to allowing greater flexibility in thinning rate, and providing fewer systems for read-out gates and terminals.

EXAMPLE 5

Structured as shown in FIG. 2A, a solid-state imaging device according to Example 5 includes the photo diodes 100, the read-out units 101, the first column CCDs 110, the transfer control units 207, the drains 251, the row CCD 300, and the signal outputting unit 301. Structured as shown in FIG. 2B, each of the transfer control units 207 includes: the storage gate 120, the hold gate 130, the second column CCD 210, the junction unit 221, and a corresponding one of the drain gates 250. The second column CCD 210 includes the splitting unit 211, and the column CCD terminal gate 212.

The transfer control unit 207 transfers packets to the corresponding one of the drains 251 across row scanning periods.

Figure 9:
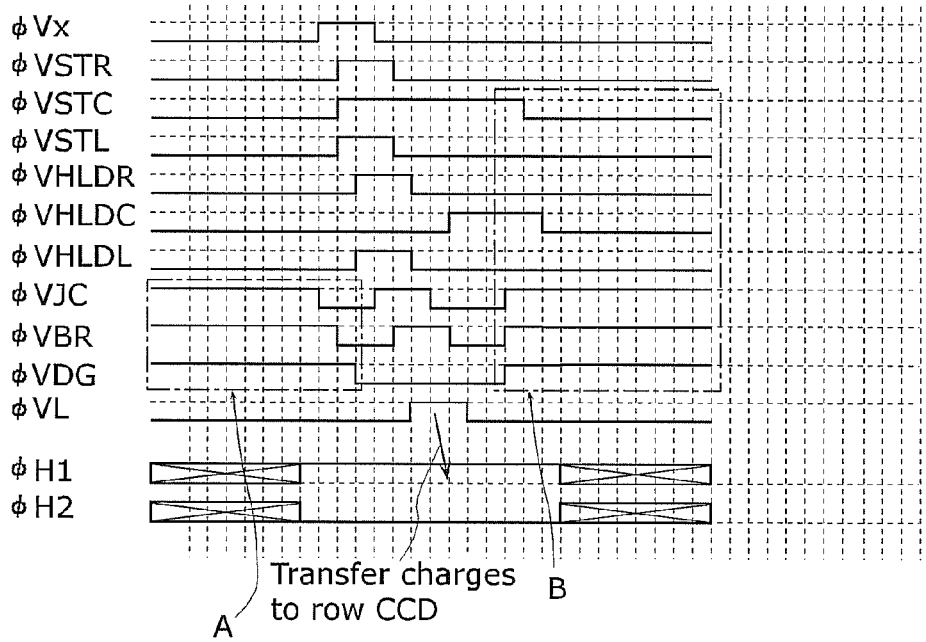
FIG. 9 shows a timing diagram showing an operation of a transfer control unit according to Example 5 in Embodiment 1.

FIG. 9 depicts a timing diagram showing an operation of the transfer control unit 207. It is note that A in FIG. 9 shows the case where the charges are swept-off into the drain across the row scanning periods. B in FIG. 9 shows the case where the charges found in the second column and held in the transfer control units are transferred to a group of Middle gates leading to the drain.

The operation in FIG. 9 differs from that in FIG. 4 in that the operation in FIG. 9 involves continuously supplying, across the row scanning periods, the MIDDLE level voltages φVJC, φVBR, and φVDG that have been supplied to the junction unit 221, the splitting unit 211, and the drain gate 250 in order to thin signals of the photo diodes 100 in a predetermined column. This operation allows the junction unit 221, the splitting unit 211, and the drain gate 250 to be set to the MIDDLE level voltages, and the column CCD terminal gate 212 to be continuously set to the LOW level voltage during the row scanning periods. As a result, the packets-to-be-thinned are swept-off into the drain 251 across the row scanning periods. Moreover, even though unnecessary charges develop in the first column CCDs 110 and increase to the point of overflowing a barrier gate, the unnecessary charges do not move to or flow into the row CCD 300 from the splitting unit 211. Instead, the unnecessary charges move through the drain gate 250 and flows into the drain 251.

In addition to thinning pixel signals in a row direction, as described above, the solid-state imaging device according to Example 5 can also can prevent the unnecessary charges developing in the row scanning periods and overflowing the first column CCDs 110 from flowing into the row CCD 300. Moreover, since the operation period can be shared between the sweeping-off drive into the drain 251 and another drive, the driving time can be made shorter than that (the driving in FIG. 8) of sweeping the packets to-be-thinned into the drain 251 during the row blanking intervals.

EXAMPLE 6

Structured as shown in FIG. 2A, a solid-state imaging device according to Example 6 includes: the photo diodes 100, the read-out units 101, the first column CCDs 110, the transfer control units 207, the drains 251, the row CCD 300, and the signal outputting unit 301. Structured as shown in FIG. 2B, each of the transfer control units 207 includes: the storage gate 120, the hold gate 130, the second column CCD 210, the junction unit 221, and the drain gate 250. The second column CCD 210 includes the splitting unit 211, and the column CCD terminal gate 212.

Described next is an operation of the transfer control unit 207 for sweeping-off an empty packet into the drain 251.

Figure 10:
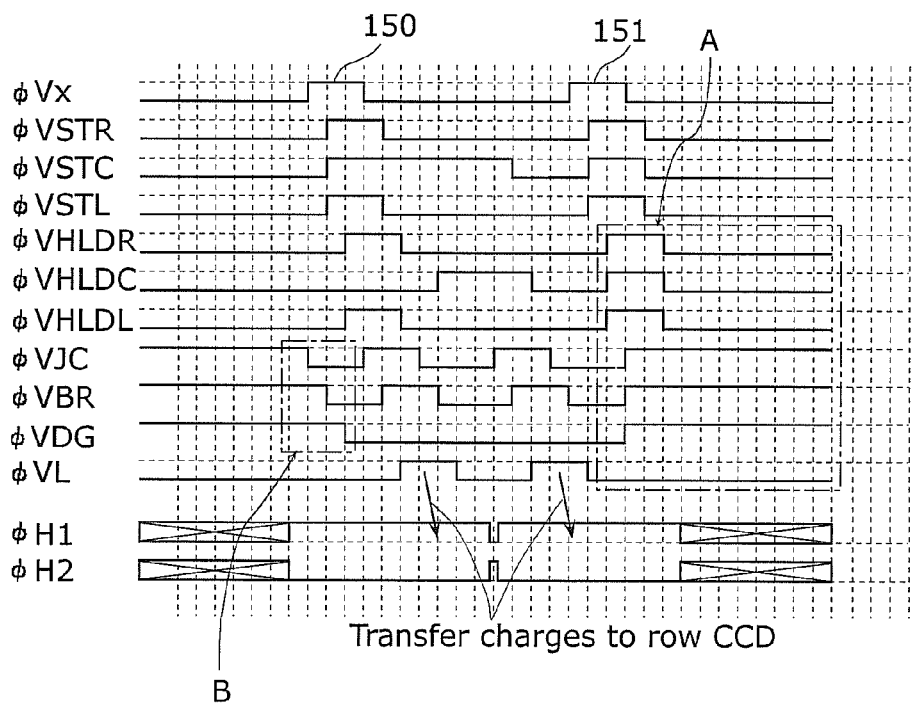
FIG. 10 shows a timing diagram showing an operation of a transfer control unit according to Example 6 in Embodiment 1.

FIG. 10 depicts a timing diagram showing an operation of the transfer control unit 207. It is noted that A in FIG. 10 shows the case where the charges in an empty packet flow into the group of Middle gates leading to the drain. B in FIG. 10 shows the case where φVDG is changed from Middle to the Low level such that the VCCD overflow charges in the row scanning period and the charges in an empty packet are swept-off into the drain.

The operation in FIG. 10 differs from that in FIG. 7 in that the operation in FIG. 10 involves continuously supplying, across the row scanning periods, the MIDDLE level voltages φVJC, φVBR, and φVDG that have been supplied to the junction unit 221, the splitting unit 211, and the drain gate 250 in order to sweep-off each empty packet 151 into the drain gate 250. This operation allows the junction unit 221, the splitting unit 211, and the drain gate 250 to be set to the MIDDLE level voltages, and the column CCD terminal gate 212 to be continuously set to the LOW level voltage during the row scanning periods. As a result, each of the empty packets 151 is swept-off into the drain 251 across the row scanning periods. Moreover, even though unnecessary charges develop in the first column CCDs 110 and increase to the point of overflowing a barrier gate, the unnecessary charges do not move to or flow into the row CCD 300 from the splitting unit 211. Instead, the unnecessary charges move through the drain gate 250 and flows into the drain 251.

In addition to sweeping-off the empty packets 151, as described above, the solid-state imaging device according to Example 6 can also can prevent the unnecessary charges developing in the row scanning periods and overflowing the first column CCDs 110 from flowing into the row CCD 300. Moreover, since the operation period can be shared between the sweeping-off drive into the drain 251 and another drive, the driving time can be made shorter than that (the driving in FIG. 8) of sweeping the packets to-be-thinned into the drain 251 during the row blanking intervals.

In the operation in FIG. 10, the transfer control unit 207 may handle the charge packet to-be-thinned 152 instead of the empty packet 151.

EXAMPLE 7

Figure 11:
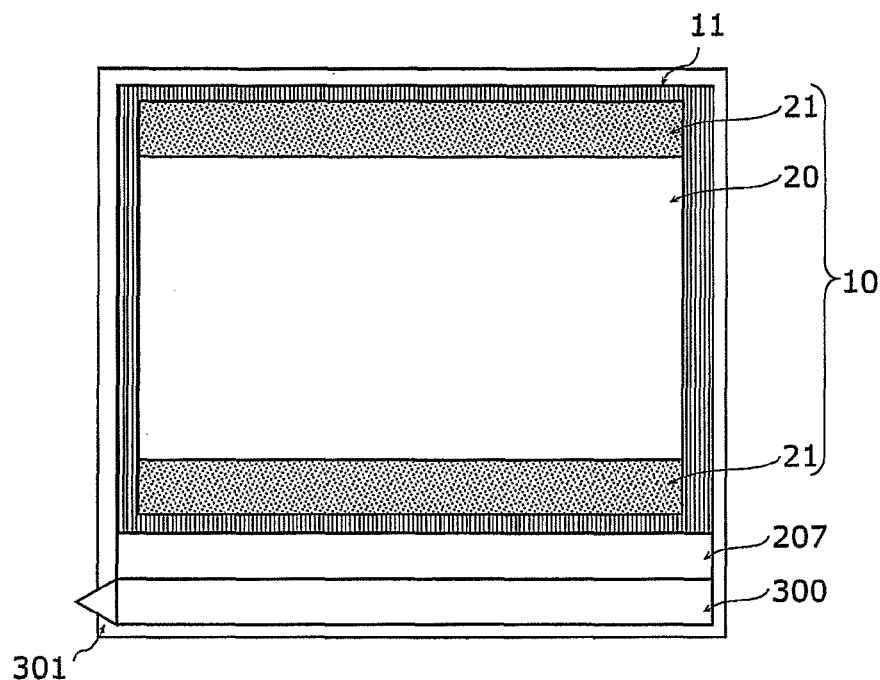
FIG. 11 shows a structure of a solid-state imaging device according to Example 7 in Embodiment 1.

FIG. 11 shows a structure of a solid-state imaging device according to Example 7.

The solid-state imaging device according to Example 7 includes: an imaging unit 10, an optical black unit 11, the transfer control unit 207, drains (not shown), the row CCD 300, and the signal outputting unit 301. Structured as shown in FIG. 2B, the transfer control units 207 includes: the storage gate 120, the hold gate 130, the second column CCD 210, the junction unit 221, and the drain gate 250. The second column CCD 210 includes the splitting unit 211, and the column CCD terminal gate 212.

The imaging unit 10 has an imbalanced aspect ratio with a horizontally wider angle of view. The imaging unit 10 is an area in which imaging signals are read out, and has photo diodes two dimensionally arranged. The imaging unit 10 includes: a signal output area 20 whose angle of view is greater in width than in height, and signal sweeping-off areas 21 each provided on top and bottom of the signal output area 20. Compared with the imaging unit 10, the signal output area 20 has a horizontally wider angle of view. The signal output area 20 and the signal sweeping-off area 21 includes the photo diodes, a read-out unit, and the first column CCDs.

In the above structured solid-state imaging device, the transfer control unit 207 transfers, from the splitting unit 211 found in the transfer control unit 207 itself to drain 251, a packet including signal charges from the photo diodes included in the signal sweeping-off areas 21 other than the signal output area 20, and sweeps off the packet. Then, the transfer control unit 207 transfers, to the row CCD 300, only a packet including signal charges from the photo diodes included in the signal output area 20, and causes the row CCD 300 to output signals. This operation allows a faster image output and a higher frame rate.

In general, when there are signals in some areas on top and bottom of the imaging unit 10, and the signals are not outputted as imaging information but swept-off, the period in which the signal charges in the area are swept-off is considered as an invalid period. In such an invalid period, a driving pulse, that ignores the column relationship between the column CCDs and the row CCD, is applied, and high-speed transfer is carried out. The solid-state imaging device according to Example 7 not only reduces a transfer time for transferring, from the row CCD 300 to the signal outputting unit 301, the signal charges in the signal sweeping-off areas 21. In addition, the solid-state imaging device also reduces consumption power since the driving pulse of the row CCD 300 is canceled while the signal charges in the signal sweeping-off areas 21 are being swept into the drain 251.

(Embodiment 2)

Figure 12A:
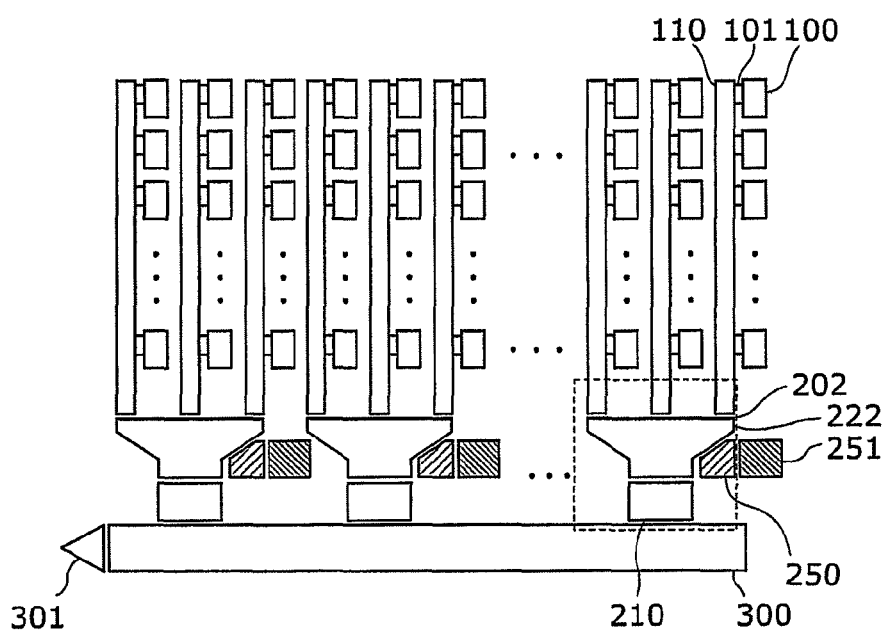
FIG. 12A shows a structure of a solid-state imaging device according to Embodiment 2 of the present invention.
Figure 12B:
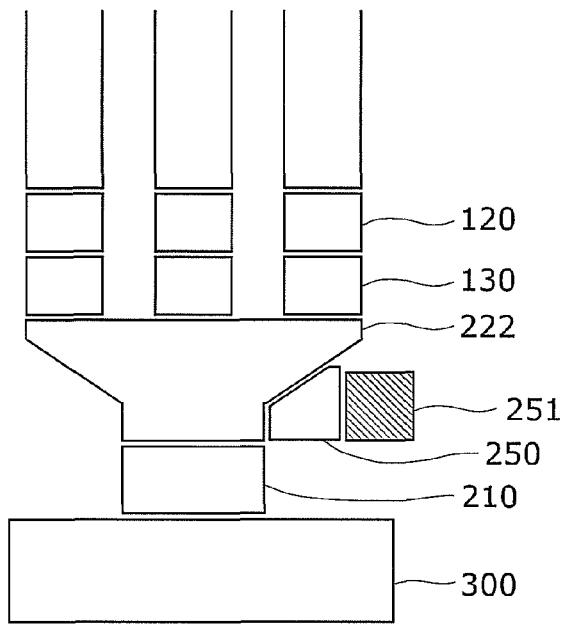
FIG. 12B shows structures of a transfer control unit and a drain according to Embodiment 2.

FIG. 12A shows a structure of a solid-state imaging device according to Embodiment 2. FIG. 12B shows structures of a transfer control unit 202 and the drain 251.

Structured as shown in FIG. 12A, the solid-state imaging device includes: the photo diodes 100, the read-out units 101, the first column CCDs 110, the transfer control units 202, the drains 251, the row CCD 300, and the signal outputting unit 301.

Each of the transfer control units 202 is provided to corresponding two or more of the first column CCDs 110. The transfer control unit 202 transfers, to the row CCD 300 and the drain 251, the charges transferred by the corresponding first column CCDs 110.

As shown in FIG. 12B, the transfer control unit 202 includes the storage gate 120, the hold gate 130, the second column CCD 210, a junction unit 222, and the drain gate 250. The second column CCD 210 has a column CCD terminal gate (not shown) which is provided between the second column CCD 210 itself and the row CCD 300 and which forms a potential barrier therebetween.

The transfer control unit 202 differs from the transfer control unit 201 in Example 1 in that the transfer control unit 202 has a branched part in a charge transfer path from the junction unit 222 to the drain 251 via the drain gate 250.

The junction unit 222 is provided between the second column CCD 210 and the first column CCDs 110 corresponding to the transfer control unit 202 in which the junction unit 222 itself is provided. The junction unit 222 transfers, to the second column CCD 210, the charges transferred from the corresponding first column CCDs 110. The drain gate 250 is provided between the junction unit 222 and the drain 251, and forms a potential barrier therebetween.

In the transfer control unit 202, three of the first column CCDs 100, corresponding to three columns of the photo diodes 100, merge with each other at the junction unit 222.

A driving pulse is supplied to the storage gates 120 and the hold gates 130 for controlling the transfer of charges from the first column CCDs 110 to the junction unit 222. Specifically, driving pulses φVSTL and φVHLDL are respectively supplied to the storage gate 120 and the hold gate 130 both provided between the first column of the three merging first column CCDs 110 and the junction unit 222. Driving pulses VSTC and φVHLDC are respectively supplied to the storage gate 120 and the hold gate 130 have both provided between the second column of the three merging first column CCDs 110 and the junction unit 222. Driving pulses φVSTR and φVHLDR are respectively supplied to the storage gate 120 and the hold gate 130 both provided between the third column of the three merging first column CCDs 110 and the junction unit 222.

The driving pulse φVJC is supplied to the junction unit 222. The driving pulse φVL is supplied to the column CCD terminal gate of the second column CCD 210. The driving pulse φVDG is supplied to the drain gate 250.

The first column CCDs 110 have the column transfer pulse φVx supplied to. The row CCD 300 has row transfer pulses φH1 and φH2 supplied to.

In the transfer control unit 202, the junction unit 222 also works as a splitting unit into the drain gate 250 and the drain 251. Compared with a structure with the splitting unit separately provided, this structure makes it possible to provide fewer gates for the second column CCD 210. In the transfer control unit 207 according to Example 1, separate two systems of transfer pulses are applied to the junction unit 221 and the splitting unit 211. In the transfer control unit 202, instead, only a single system transfer pulse may be applied to the junction unit 222. The single system transfer pulse is used for both of the merging and splitting.

Figure 12C:
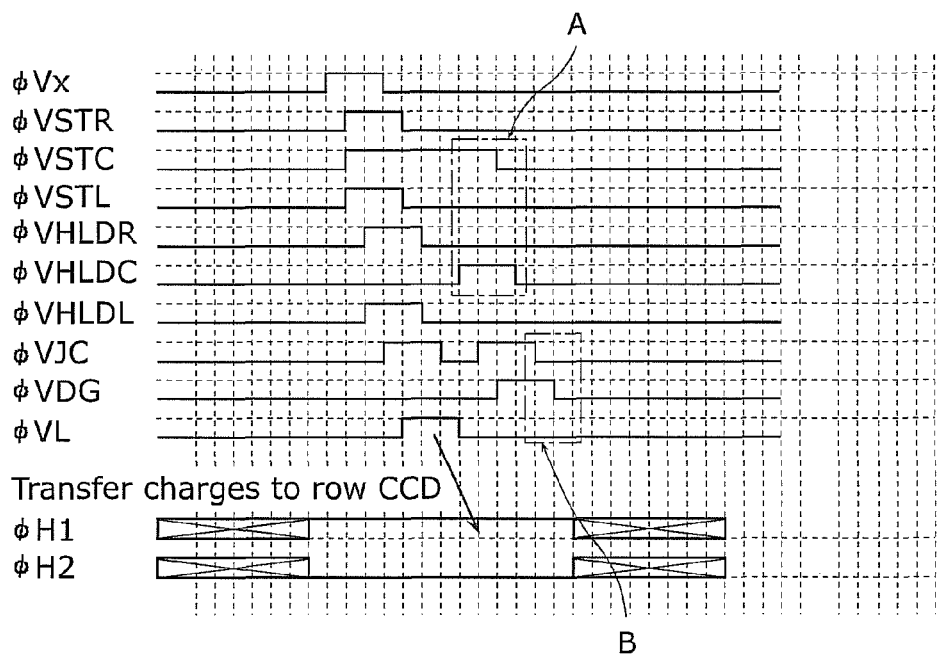
FIG. 12C shows a timing diagram showing an operation of the transfer control unit according to Embodiment 2.

FIG. 12C depicts a timing diagram showing an operation of the transfer control unit 202. The timing diagram in FIG. 12C shows a waveform of each driving pulse when the transfer control unit 202 according to Embodiment 2 carries out the thinning operation per column of Example 1 in FIG. 4. It is noted that A in FIG. 12C shows the case where the charges in the second column among three of the column CCDs are not transferred to the row CCD, but are held in the transfer control unit. B in FIG. 12C shows the charges found in the second column and held in the transfer control are swept-off into the drain.

The comparison between FIG. 12C and FIG. 4 clearly shows that the row blanking interval is shorter in the operation in FIG. 12C than in the operation in FIG. 4, since no φVBR is found in FIG. 12C.

As described above, the solid-state imaging device according to Embodiment 2 requires fewer driving pulse systems. Hence, the solid-state imaging device needs fewer terminals and fewer channels for the driving pulse controlling unit which is provided aside from the solid-state imaging device in order to supply a driving pulse. Furthermore, the solid-state imaging device can shorten the row blanking interval, which contributes to achieving a higher frame rate.

(Embodiment 3)

Figure 13A:
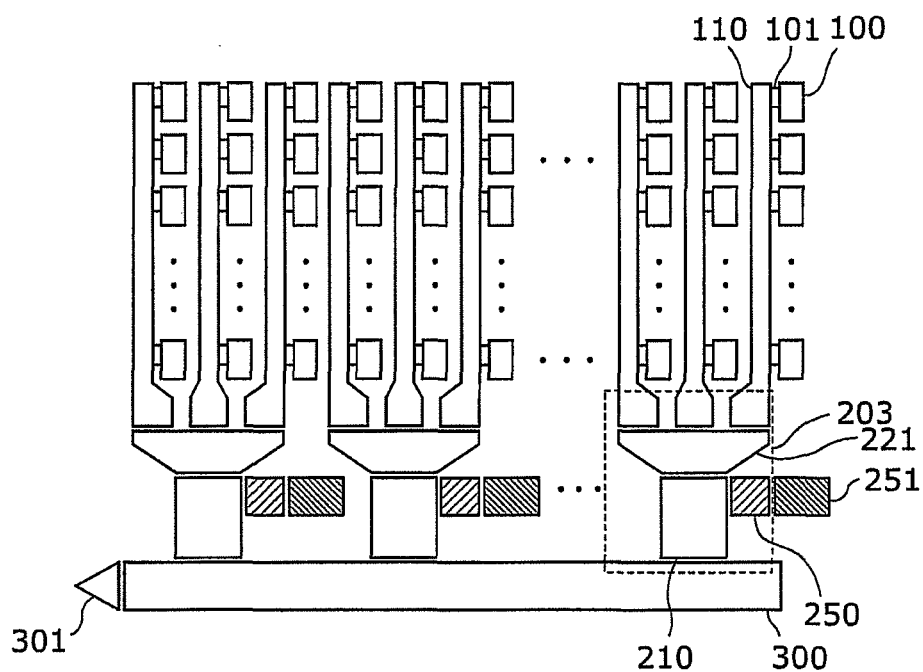
FIG. 13A shows a structure of a solid-state imaging device according to Embodiment 3 of the present invention.

FIG. 13A shows a structure of a solid-state imaging device according to Embodiment 3.

Structured as shown in FIG. 13A, the solid-state imaging device includes: the photo diodes 100, the read-out units 101, the first column CCDs 110, the transfer control units 203, the drains 251, the row CCD 300, and the signal outputting unit 301.

Each of the transfer control units 203 is provided to corresponding two or more of the first column CCDs 110. The transfer control unit 203 transfers, to the row CCD 300 and a corresponding one of the drains 251, the charges transferred by the corresponding first column CCDs 110.

The transfer control unit 203 includes: a storage gate (not shown), a hold gate (not shown), the second column CCD 210, the junction unit 221, and the drain gate 250. The second column CCD 210 has a column CCD terminal gate (not shown) and a splitting unit (not shown). The column CCD terminal gate is provided between the second column CCD 210 itself and the row CCD 300, and forms a potential barrier therebetween.

In the transfer control unit 203, three of the first column CCDs 100, corresponding to three columns of the photo diodes 100, merge with each other at the junction unit 221.

Each of hold gates is provided to a corresponding one of the first column CCDs 110 that are corresponding to the transfer control unit 203 including the hold gate itself. The hold gate forms a potential barrier between the corresponding first column CCD 110 and the junction unit 221.

The transfer control unit 203 differs from the transfer control unit 207 according to Example 1 in that the transfer control unit 203 (i) has the storage gates and the hold gates with wider channel widths, the storage gates which are adjacent to the end portions of the first column CCDs 110 and (ii) has the middle lines of the channels arranged closer with each other than the middle lines of the first column CCDs 110, with respect to the columns merging at the junction unit 222. The solid-state imaging device according to Embodiment 3 differs from that according to Example 1 in that, in each transfer control unit 203, the space between the channels of the hold gates corresponding to the neighboring first column CCDs 110 is narrower than the space between the neighboring first column CCDs 110.

Each of the first column CCDs 110 needs to have the channel width widened at the end portion in order to reduce a transmission defect in the connecting portion with the junction unit 221. In order to make sure to have enough space to form the drain 251 and the drain gate 250, however, the channel width of the junction unit 221 needs to be tapered toward the charge transfer direction. Due to the tapering, a narrow channel effect could develop a potential gradient opposite the charge transfer direction. The transfer control unit 203, however, allows the channel widths to be made narrower on the first column CCDs 110 side in the junction unit 221, and the channels to be formed with a moderate angle. Such structure contributes to preventing a transmission defect due to the reversal potential gradient at the junction unit 221. In addition, a wider space is provided to form the drain 251 and the drain gate 250, which contributes to preventing breakdown and punchthrough due to the application of a high voltage to the drain 251.

Figure 13B:
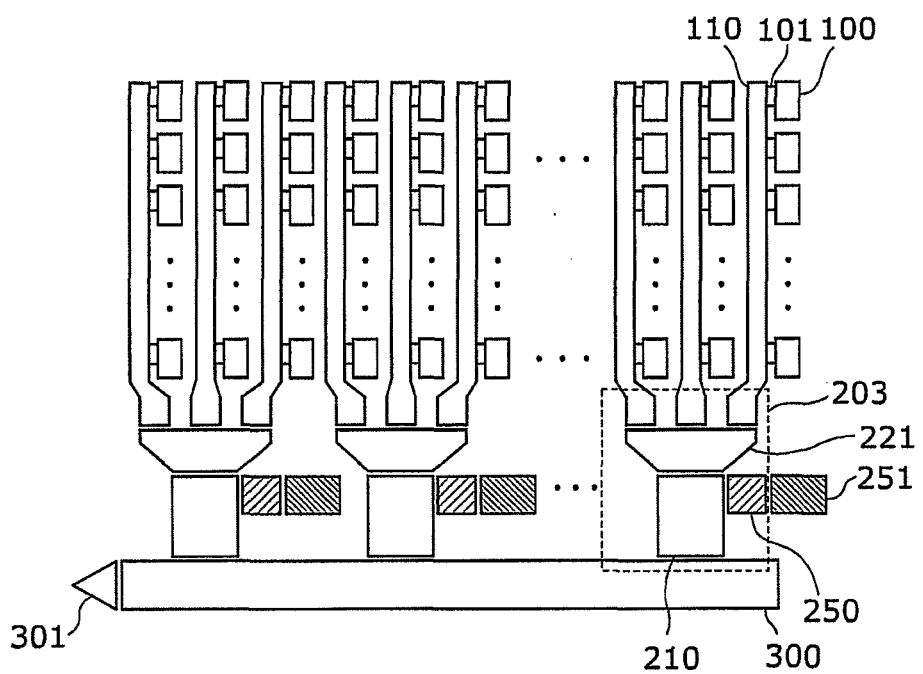
FIG. 13B shows an Example of the structure of the solid-state imaging device according to Embodiment 3 of the present invention.
Figure 13C:
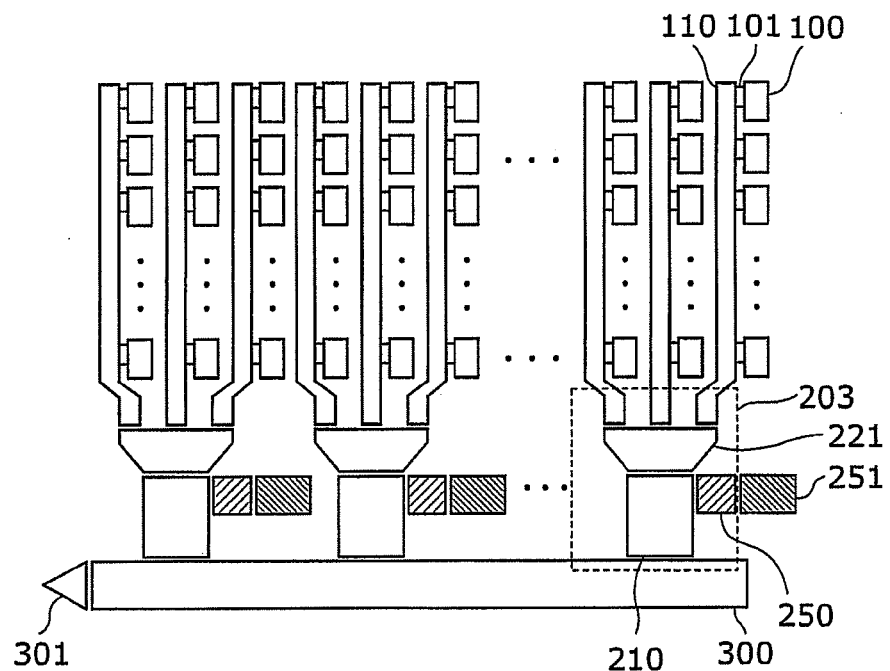
FIG. 13C shows another Example of the structure of the solid-state imaging device according to Embodiment 3 of the present invention.

It is noted that the transfer control unit 203 is structured as shown in FIG. 13A, such that the middle lines of the storage gates and the hold gates are arranged closer with each other among the merging columns. The transfer control unit 203 may also be structured as shown in FIG. 13B or 13C. The structure in FIG. 13B makes it possible to curb the increase in the channel widths of the storage gates and the hold gates. Moreover, the structure in FIG. 13C makes it possible to have the middle lines arranged closer with each other among the merging columns than the middle lines shown in the structure in FIG. 13A, without changing the channel widths of the storage gates and the hold gates. Compared with the structure in FIG. 13A, either one of the structures in FIGS. 13B and 13C can form the junction unit 221 in a smooth taper. Such a structure contributes to enhancing an effect of preventing a transmission defect due to the reversal potential gradient at the junction unit 221, as well as to providing far more enough space for forming a drain.

(Embodiment 4)

Figure 14A:
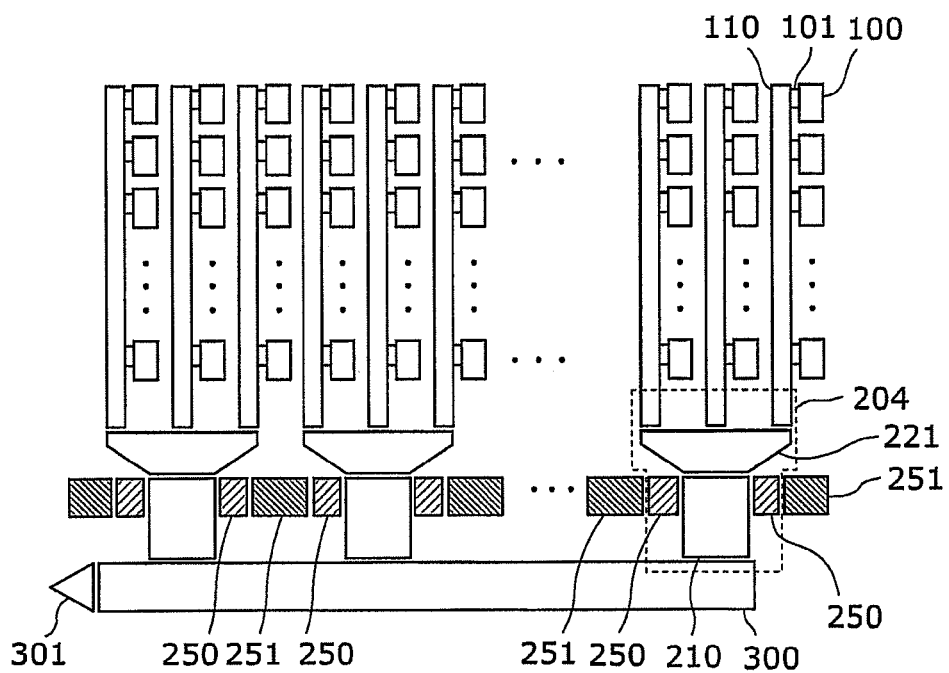
FIG. 14A shows a structure of a solid-state imaging device according to Embodiment 4 of the present invention.
Figure 14B:
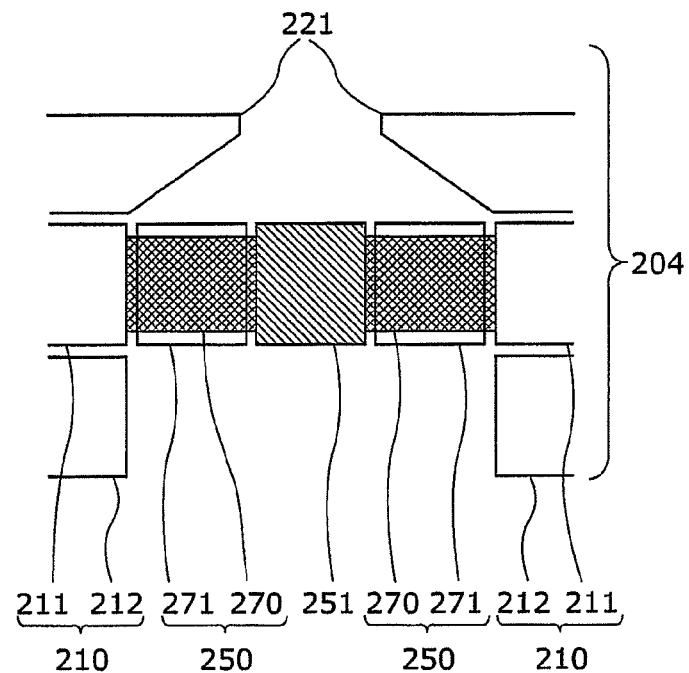
FIG. 14B shows structures of a transfer control unit and a drain according to Embodiment 4.

FIG. 14A shows a structure of a solid-state imaging device according to Embodiment 4. FIG. 14B shows structures of a transfer control unit 204 and the drain 251.

Structured as shown in FIG. 14A, the solid-state imaging device includes: the photo diodes 100, the read-out units 101, the first column CCDs 110, the transfer control units 204, the drains 251, the row CCD 300, and the signal outputting unit 301.

Each of the transfer control units 204 is provided to corresponding two or more of the first column CCDs 110. The transfer control unit 204 transfers, to the row CCD 300 and the drains 251, the charges transferred by the corresponding first column CCDs 110.

As shown in FIG. 14B, the transfer control unit 204 includes a storage gate (not shown), a hold gate (not shown), the second column CCD 210, the junction unit 221, and the drain gate 250. The second column CCD 210 has the splitting unit 211 and the column CCD terminal gate 212. The column CCD terminal gate 212 is provided between the second column CCD 210 itself and the row CCD 300, and forms a potential barrier therebetween. Each of drain gates 250 is formed of a gate electrode 271 and a charge transfer channel (channel region) 270 provided below the gate electrode 271.

Each of drains 251 is provided between the neighboring transfer control units 204. The charges of the neighboring transfer control units 204 are swept-off into the drain 251.

In the transfer control unit 204, one gate electrode 271 is provided on one charge transfer channel 270 connecting the drain 251 with the second column CCD 210. The drain gate 250 is formed in an island. Hence, in order to apply a driving pulse to the drain gate 250, a line is provided to connect the drain gate 250 with a terminal receiving a pulse from outside.

In the transfer control unit 204, three of the first column CCDs 110 are merged at the junction unit 221. The first column CCDs 110 correspond to three of the columns of the photo diodes 100.

The transfer control unit 204 differs from the transfer control unit 207 in Example 1 in that the transfer control unit 204 has each of the drains 251 and each of the drain gates 250 arranged on the both sides of the second column CCD 210 (the transfer control unit 204).

In the solid-state imaging device according to Embodiment 4, as described above, the transfer control unit 204 has each drain gate 250 provided between the second column CCD 210 and both sides of the drains 251. The drain gate 250 forms a potential barrier between the second column CCD 210 and the drain 251. Thus, when the charges in the second column CCD 210 are swept into the drain 251, the solid-state imaging device can completely sweep-off the charges at a high speed since there is a path for the sweeping on both sides.

(Embodiment 5)

Figure 15:
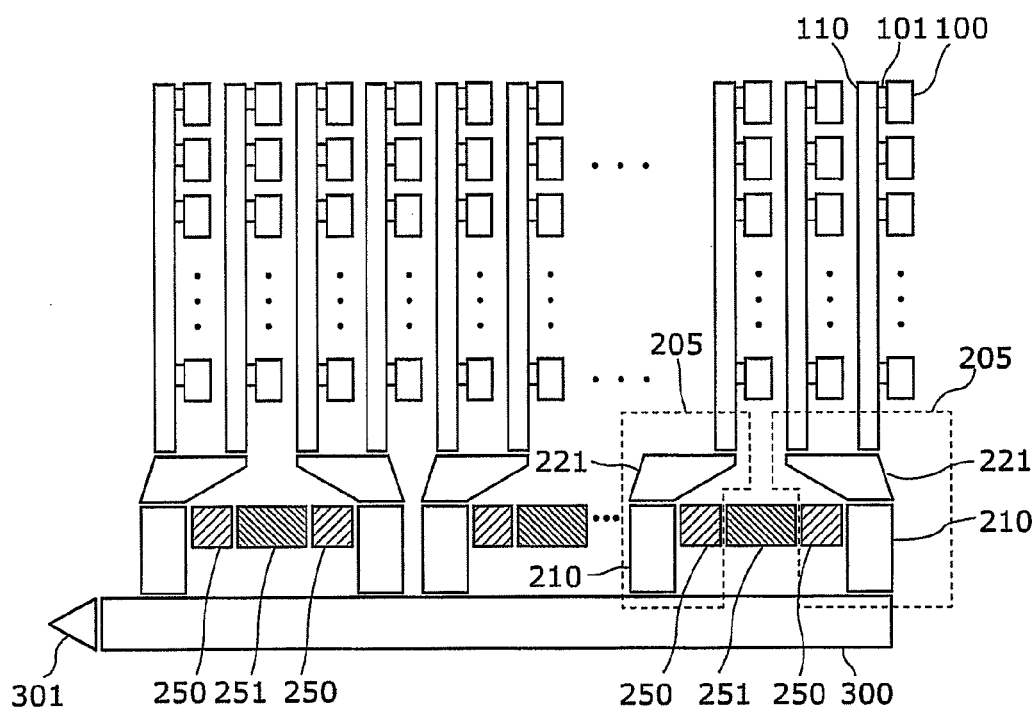
FIG. 15 shows a structure of a solid-state imaging device according to Embodiment 5 of the present invention.

FIG. 15 shows a structure of a solid-state imaging device according to Embodiment 5.

Structured as shown in FIG. 15, the solid-state imaging device includes: the photo diodes 100, the read-out units 101, the first column CCDs 110, the transfer control units 205, the drains 251, the row CCD 300, and the signal outputting unit 301.

Each of the transfer control units 205 is provided to corresponding two or more of the first column CCDs 110. The transfer control unit 205 transfers, to the row CCD 300 and the drain 251, the charges transferred by the corresponding first column CCDs 110.

The transfer control unit 205 includes a storage gate (not shown), a hold gate (not shown), the second columns CCD 210, the junction units 221, and the drain gates 250. Each of the second column CCD 210 has a splitting unit (not shown) and a column CCD terminal gate (not shown). The column CCD terminal gate is provided between the second column CCD 210 itself and the row CCD 300, and forms a potential barrier therebetween.

In the transfer control unit 205, two of the first column CCDs 110 are merged at the junction unit 221. The two columns of the photo diodes 100 correspond to two of the columns of the photo diodes 100.

The transfer control unit 205 differs from the transfer control unit 207 in Example 1 as follows: In the transfer control unit 205, (i) the second column CCDs 210 are arranged with unequal intervals in a row direction and with a space provided between each two columns and (ii) in each space, a drain structure (the drain gate 250 and the drain 251) is formed.

The drain 251 is provided between the neighboring transfer control units 205. The charges of the neighboring transfer control units 205 are swept-off into the drain 251. Each drain 251 is provided for every two of the transfer control units 205 (two of the second columns CCD 210).

In the solid-state imaging device according to Embodiment 5, as described above, the transfer control unit 205 has the drain gate 250 provided on either side of the second column CCD 210. On the outside of the drain gate 250, the drain 251 is provided. On the other side of the second column CCD 210, another one of the second column CCD 210 is provided. Concurrently, the drain gates 250 are provided on both sides of the drain 251. On the outside of each of the drain gates 250, the second column CCD 210 is provided. The drain gate 250 is provided between the second column CCD 210 and the drain 251, and forms a potential barrier therebetween. Thus, one drain 251 is shared by two different second column CCDs 210, and the charges from the two different second column CCDs 210 are swept into the one drain 251. As a result, only half as many drains 251 as the second column CCDs 210 are required. Thus, the technique of the solid-state imaging device according to Embodiment 5 is very useful for a highly-fined solid-state imaging device today.

(Embodiment 6)

Figure 16A:
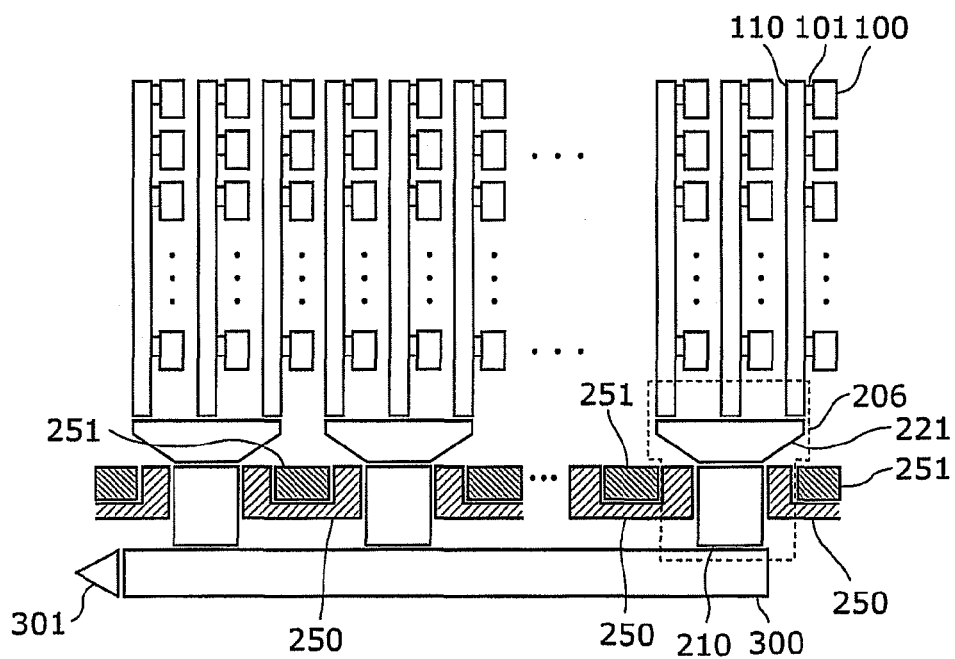
FIG. 16A shows a structure of a solid-state imaging device according to Embodiment 6 of the present invention.
Figure 16B:
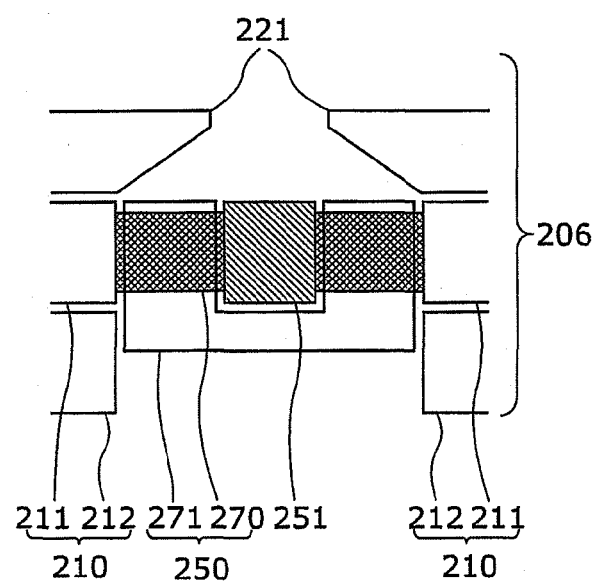
FIG. 16B shows structures of a transfer control unit and a drain according to Embodiment 6.

FIG. 16A shows a structure of a solid-state imaging device according to Embodiment 6. FIG. 16B shows structures of a transfer control unit 206 and the drain 251.

Structured as shown in FIG. 16A, the solid-state imaging device includes: the photo diodes 100, the read-out units 101, the first column CCDs 110, transfer control units 206, the drains 251, the row CCD 300, and the signal outputting unit 301.

Each of the transfer control units 206 is provided to corresponding two or more of the first column CCDs 110. The transfer control unit 206 transfers, to the row CCD 300 and the drain 251, the charges transferred by the corresponding first column CCDs 110.

As shown in 16B, the transfer control unit 206 includes a storage gate (not shown), a hold gate (not shown), the second column CCD 210, the junction unit 221, and the drain gate 250. The second column CCD 210 has the splitting unit 211 and the column CCD terminal gate 212. The column CCD terminal gate 212 is provided between the second column CCD 210 itself and the row CCD 300, and forms a potential barrier therebetween. The drain gate 250 is formed of the gate electrode 271 and the charge transfer channel (channel region) 270 provided below the gate electrode 271.

In the transfer control unit 206, three of the first column CCDs 110 are merged at the junction unit 221. The three first column CCDs 110 correspond to three of the columns of the photo diodes 100.

The transfer control unit 206 differs from the transfer control unit 204 according to Embodiment 4 and the transfer control unit 205 according to Embodiment 5 in that the transfer control unit 206 causes one gate electrode 271 to control potential of the charge transfer channel 270 provided between the drain 251 and the second columns CCD 210 each provided on both sides of the drain 251. In other words, the transfer control unit 206 differs from the transfer control units 204 according to Embodiment 4 and the transfer control units 205 according to Embodiment 5 in that (i) the drain gates 250 for the transfer control units 206 neighboring to each other share one gate electrode and (ii) the potential of the drain gates 250 for the neighboring transfer control units 206 is controlled by one gate electrode 271.

The transfer control unit 206 differs from the transfer control unit 204 according to Embodiment 4 and the transfer control unit 205 according to Embodiment 5 in that the gate electrode 271 is formed U-shaped to surround the drain 251, and one gate electrode 271 is provided on two charge transfer channels 270. Thus, the one gate electrode 271 controls the transfer of the charges from the two transfer control units 206 (the second column CCDs 210) to the drain 251.

The drain gate 250 is formed in an island. Thus, in order to apply a driving pulse to the drain gate 250, a line needs to connect a terminal receiving the pulse from outside with for the drain gate 250. Hence, the line and the drain gate 250 have to have a contact for conductive connection. In the case of the transfer control unit 206, one gate electrode 271 can simultaneously control the potentials of two or more of the charge transfer channels 270. This structure contributes to fewer contacts between the line and the drain gate 250. Forming contacts usually requires a certain amount of space in terms of processing accuracy and breakdown, and restricts flexibility to the line. Having fewer contacts increases flexibility to the line and provides large enough space. This feature successfully increases a yield ratio.

(Embodiment 7)

Figure 17:
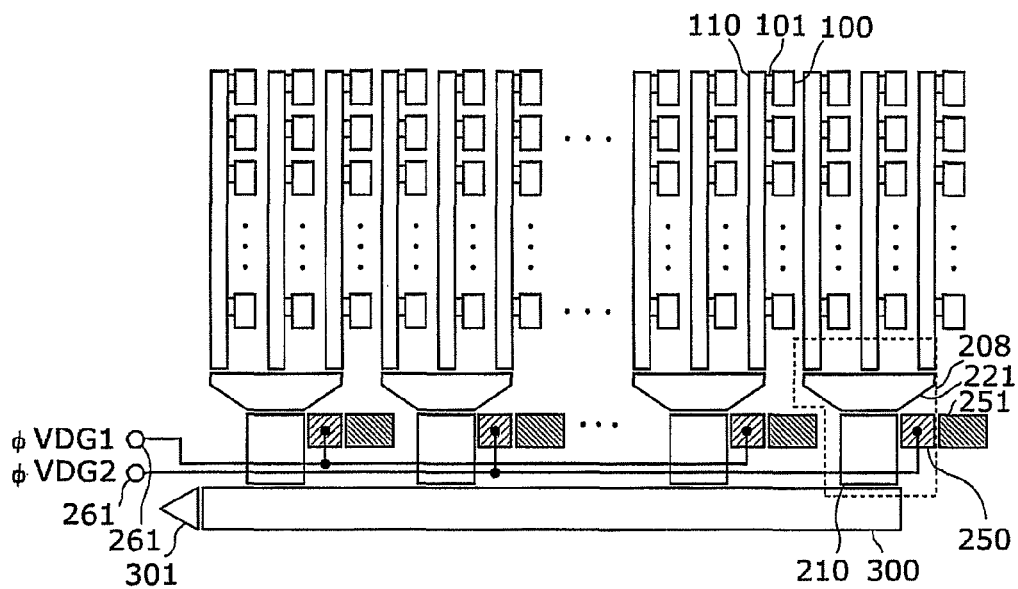
FIG. 17 shows a structure of a solid-state imaging device according to Embodiment 7 of the present invention.

FIG. 17 shows a structure of a solid-state imaging device according to Embodiment 7.

Structured as shown in FIG. 17, the solid-state imaging device includes: the photo diodes 100, the read-out units 101, the first column CCDs 110, the transfer control units 208, the drains 251, the row CCD 300, and the signal outputting unit 301.

Each of the transfer control units 208 is provided to corresponding two or more of the first column CCDs 110. The transfer control unit 208 transfers, to the row CCD 300 and the drain 251, the charges transferred by the corresponding first column CCDs 110.

The transfer control unit 208 includes a storage gate (not shown), a hold gate (not shown), the second column CCD 210, the junction unit 221, and the drain gate 250. The second column CCD 210 has a splitting unit (not shown) and a column CCD terminal gate (not shown). The column CCD terminal gate is provided between the second column CCD 210 itself and the row CCD 300, and forms a potential barrier therebetween.

In the transfer control unit 208, three of the first column CCDs 110 are merged at the junction unit 221. The three first column CCDs 110 correspond to three of the columns of the photo diodes 100.

The transfer control unit 208 differs from the transfer control unit 207 according to Example 1 in that each of drain gates 250 is connected to a different terminal 261, and has a separate driving pulse applied to. In other words, the solid-state imaging device in Embodiment 7 differs from the solid-state imaging device in Example 1 in that the drain gates 250 for the transfer control units 208 are connected to two or more terminals to which a different driving pulse φBDG is supplied. Hence, the drain gates 250 arranged in a row receive driving pulses in at least two systems, and are independently controlled.

In the solid-state imaging device in FIG. 17, three columns each of the first column CCDs 110 are connected to the second column CCD 210 via the junction unit 221. The second column CCDs 210 perform the charge transfer control for a unit of two second column CCDs 210 each arranged in a row direction and connected to a corresponding one of the two drain gates 250 controlled by an independent driving pulse. Hence, the transfer control units 208 controls the charge transfer for a repeating unit of six first column CCDs 110 arranged in a row direction. This structure makes it possible to carry out, on a six-column basis, addition of pixel signals in a row direction and thinning of the pixel signals per column. Usually, as repeating units of the transfer control units in a row direction, for transfer control, increase, more control terminals and systems for transfer pulses are required in proportion to the increase in the repeating units. The solid-state imaging device in FIG. 17, however, successfully curbs the repeating units as few as the following: The repeating units=a×b, where the number of first column CCDs 110 merging at the junction unit 221 is a, and the number of systems of the drain gates 250 is b. As a result, the solid-state imaging device can curb the increase, on a small scale, in the number of the control terminals and of the systems of the transfer pulses, and provide advanced adding and thinning of pixel signals.

(Embodiment 8)

Described hereinafter is the case where, in the solid-state imaging device in FIG. 1, a well of the semiconductor substrate (a substrate on which the solid-state imaging device is formed) is formed such that, in the case where the same voltage is applied to the drain gate 250 and the second column CCD 210, the channel region located below the drain gate 250 and the channel region of the second column CCD 210 are different with each other in potential; that is, the potential of the channel region of the drain gate 250 is shallower than that of the channel region of the second column CCD 210.

When the charges are transferred from the second column CCD 210 to the row CCD 300, the solid-state imaging device according to Embodiment 8 successfully prevents a transmission defect caused by a trouble to a transfer path due to a branching structure to the drain 251.

In contrast, in the case where a channel region having a shallow potential is provided below the drain gate 250, complete sweeping-off of the charges could be difficult when the charges are swept-off from the second column CCD 210 to the drain 251. Such a problem is solved by applying, to the drain gate 250, a voltage higher than the MIDDLE level voltage; that is, the MIDDLE level voltage to be applied to the drain gate 250 is set higher than the MIDDLE level voltage applied to the second column CCD 210.

(Embodiment 9)

Figure 18:
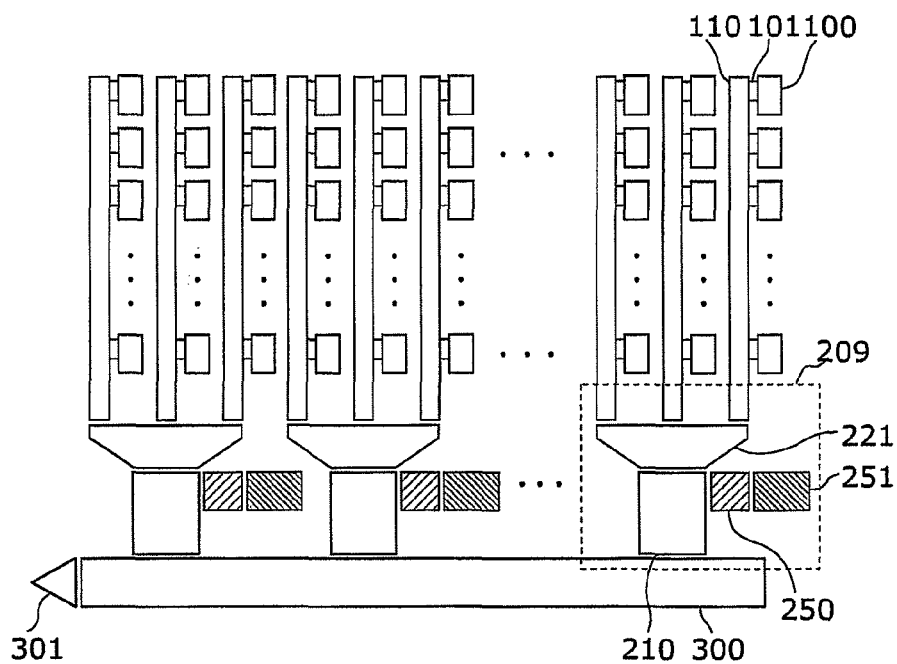
FIG. 18 shows a structure of a solid-state imaging device according to Embodiment 9 of the present invention.
Figure 19:
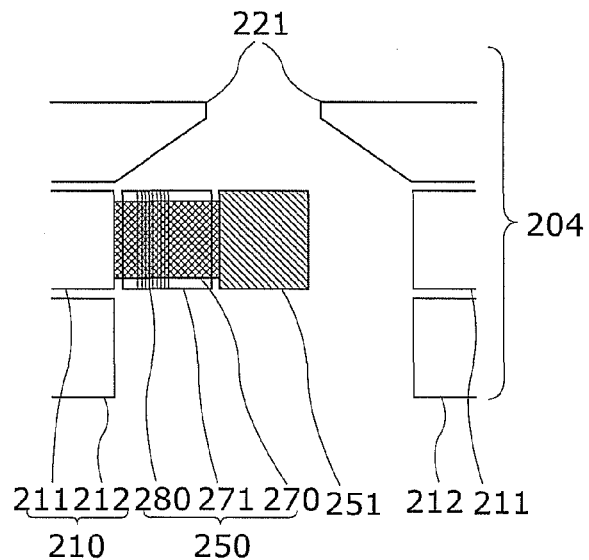
FIG. 19 shows the structure of the solid-state imaging device according to Embodiment 9 of the present invention.

FIGS. 18 and 19 show a structure of a solid-state imaging device according to Embodiment 9. FIG. 19 shows an enlarged view near a transfer control unit 209.

As shown in FIG. 18, the solid-state imaging device includes: the photo diodes 100, the read-out units 101, the first column CCDs 110, the transfer control units 209, the row CCD 300, and the signal outputting unit 301.

Each of the transfer control units 209 is provided to corresponding two or more of the first column CCDs 110. The transfer control unit 209 transfers, to the row CCD 300 and the drain 251, the charges transferred by the corresponding first column CCDs 110.

As shown in FIG. 19, the transfer control unit 209 includes a storage gate (not shown), a hold gate (not shown), the second column CCD 210, the junction unit 221, the drain gate 250, and the drain 251. The second column CCD 210 has the splitting unit 211 and the column CCD terminal gate 212. The column CCD terminal gate 212 is provided between the second column CCD 210 itself and the row CCD 300, and forms a potential barrier therebetween. The drain gate 250 is formed of the gate electrode 271, the charge transfer channel 270, and a p-type impurity region 280. The charge transfer channel 270 and the p-type impurity region 280 are provided below the gate electrode 271.

The transfer control unit 209 differs from the transfer control unit 201 according to Example 1 in that, in the charge transfer channel 270 below the gate electrode 271, a p-type impurity is injected in stripes to form the p-type impurity region 280. Moreover, the transfer control unit 209 differs from the transfer control unit 201 according to Example 1 in that pulses are applied to the drain gate 250, using the three-valued control. In other words, the solid-state imaging device according to Embodiment 9 differs from the solid-state imaging device according to Example 1 in that a driving pulse generating unit (not shown), which generates various kinds of driving pulses and, supplies the driving pulses to the solid-state imaging device, supplies the three-valued driving pulses to the drain gate 250.

Embodiments 1 to 8 involves applying two-valued (a MIDDLE level voltage and a LOW level voltage) driving pulses to the drain gate 250 to control the drain gate 250. The two-valued pulse control could fully achieve the above effects of the invention; however, such a control might develop variation in sweep-off of the charges into the drain 251 per column. Furthermore, the signal charges might inevitably flow toward the drain when the signal charges are transferred from the splitting unit 211 positioned next to the drain gate 250 to the column CCD terminal gate 212. Moreover, a potential modulation below the drain gate 250 could cause a potential dip, leading to a transmission defect.

Figure 20:
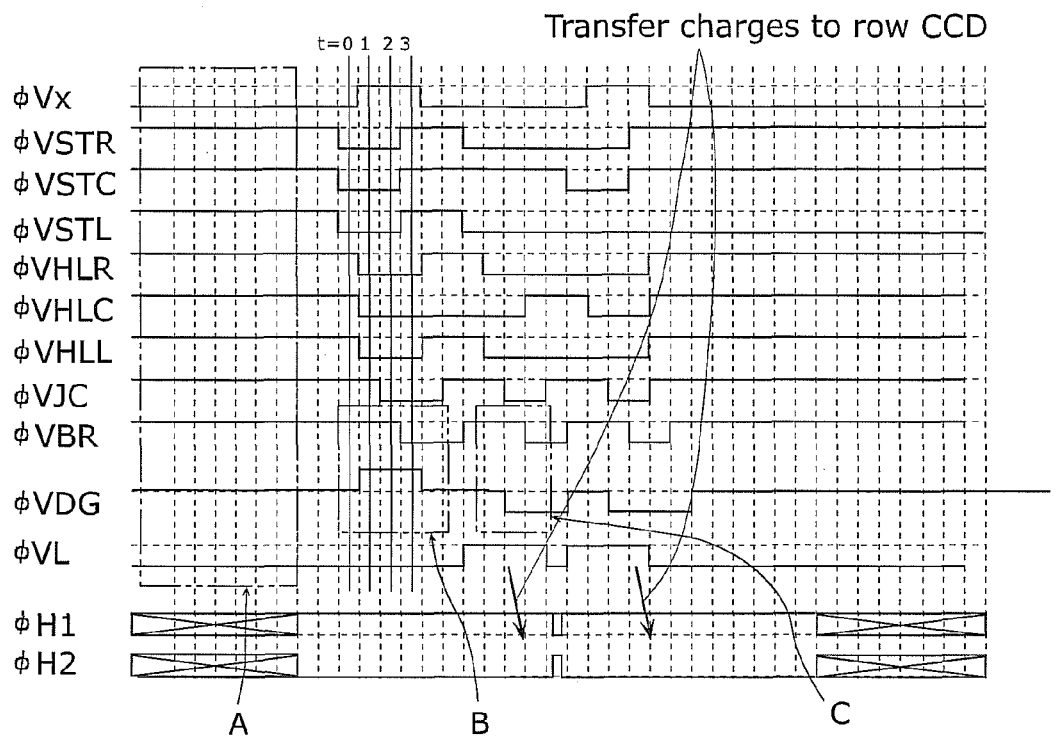
FIG. 20 shows a timing diagram showing an operation of a transfer control unit according to Embodiment 9 of the present invention.

In order to solve the above problems, Embodiment 9 introduces three-valued (a HIGH level voltage, a MIDDLE level voltage, and a LOW level voltage) voltages for driving pulses to be applied to the drain gate 250. FIG. 20 depicts a timing diagram showing an operation of the transfer control unit 209 in the above case. It is to be noted that A in FIG. 20 shows the case where φVDG is set to the Middle level such that the charges having a significantly large amount of light overflow and are swept-off to the drain, and the flowing of the charges into the row CCD is prevented. B in FIG. 20 shows the case where φVDG is set to the High level to sweep-off unnecessary charges, and furthermore φVBR on the neighboring gate is to the Low level such that unnecessary charges are easily swept-off. C in FIG. 20 shows the case where φVDG is set to the Low level to prevent a potential dip before φVBR is set to the Low level to transfer the charges.

Figure 21A:
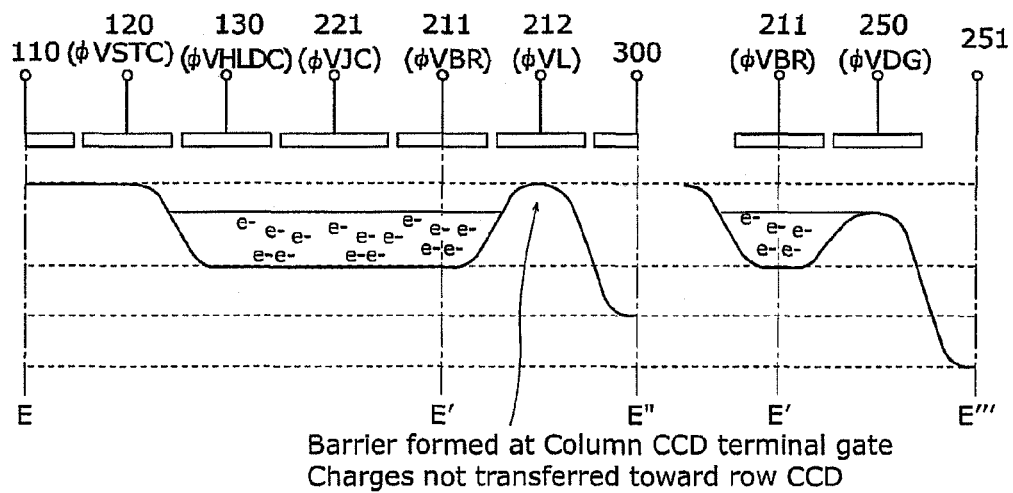
FIG. 21A shows potential distribution at t=0 when the transfer control unit according to Embodiment 9 of the present invention sweeps off empty packets to a drain.
Figure 21B:
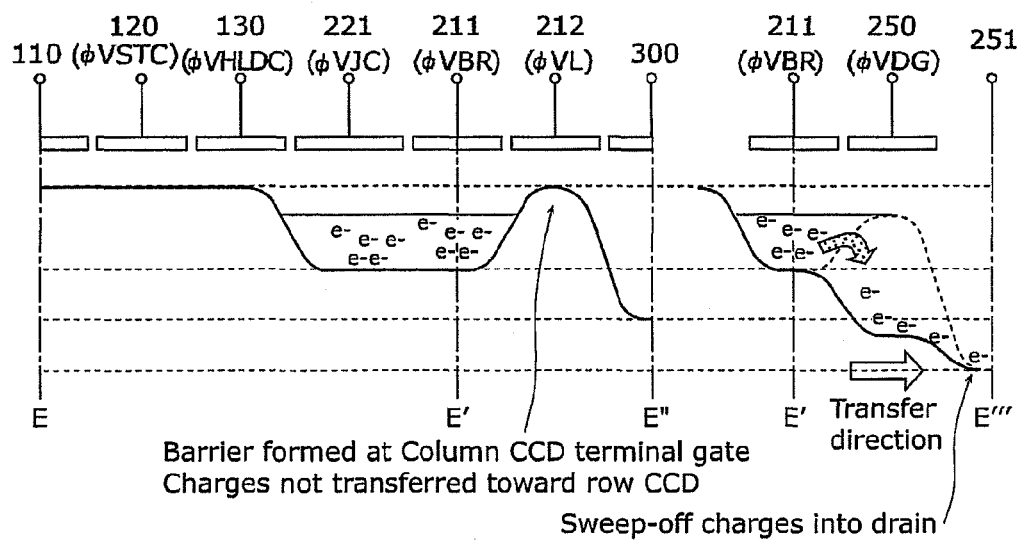
FIG. 21B shows potential distribution at t=1 when the transfer control unit according to Embodiment 9 of the present invention sweeps off the empty packets to the drain.
Figure 21C:
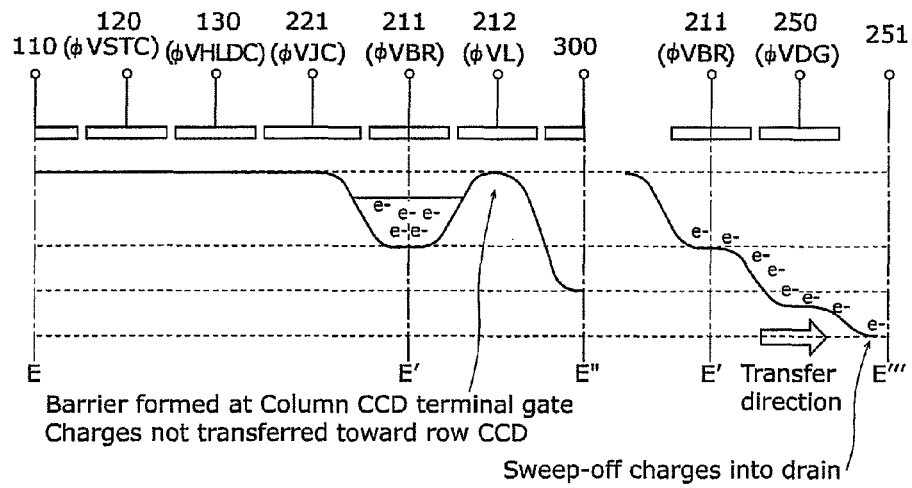
FIG. 21C shows potential distribution at t=2 when the transfer control unit according to Embodiment 9 of the present invention sweeps off the empty packets to the drain.
Figure 21D:
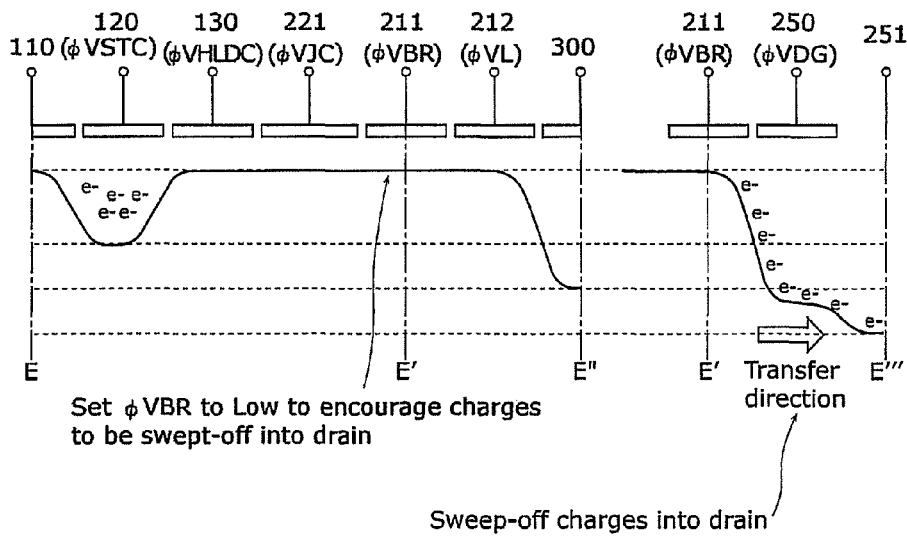
FIG. 21D shows potential distribution at t=3 when the transfer control unit according to Embodiment 9 of the present invention sweeps off the empty packets to the drain.
Figure 21E:
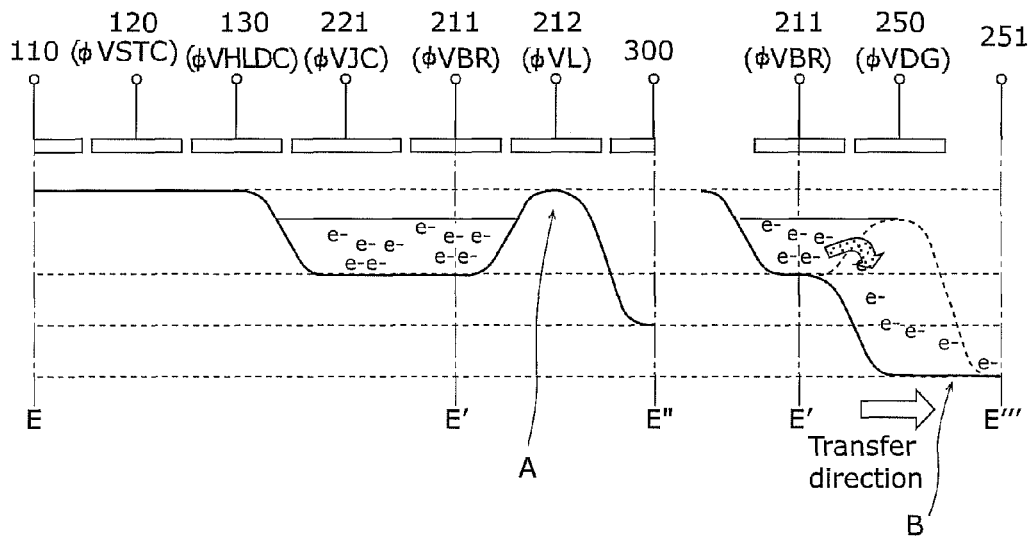
FIG. 21E shows potential distribution, whose potential under a drain gate 250 is adjusted, at t=1 when the transfer control unit according to Embodiment 9 of the present invention sweeps off the empty packets to the drain.
Figure 22:
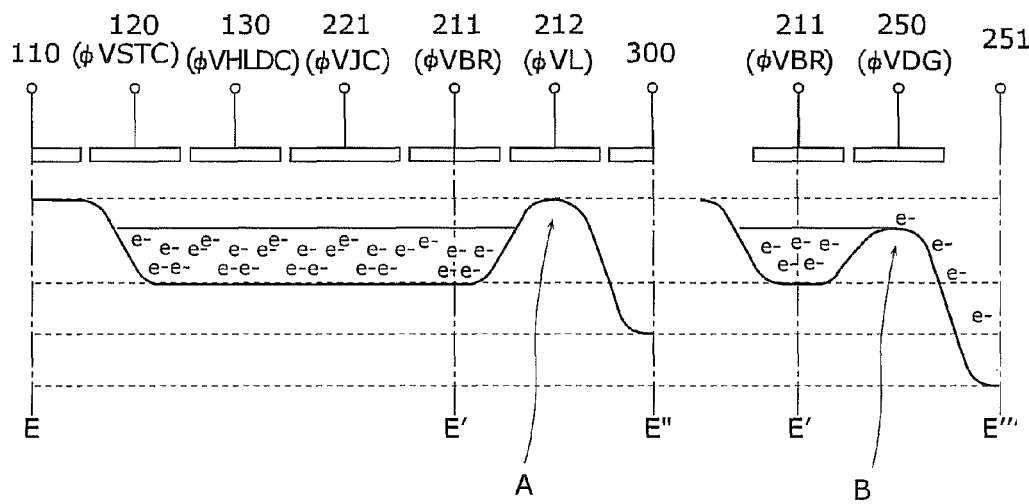
FIG. 22 shows potential distribution showing that, when a capturing object is a light source having a significant amount of light, the signal charge packets and the empty packets of the transfer control unit according to Embodiment 9 of the present invention overflow under the drain gate, and are swept-off to the drain.

FIGS. 21A to 21E show potential distributions in the transfer control unit 201 when the HIGH level voltage is applied to the drain gate 250; that is, when unnecessary charges, such as smear signals in an empty packet of the transfer control unit 209, are swept-off into the drain 251. It is noted that A in FIG. 21E shows the case where a barrier is formed at column CCD terminal gate, and the charges are not transferred toward the row CCD. B in FIG. 21E shows the case where the potential of the φVDG is set to the same potential of the drain where the charges are swept-off into the drain. It is to be noted that A in FIG. 22 shows the case where a barrier is formed at the Column CCD terminal gate, and the charges are not transferred toward the row CCD. B in FIG. 22 shows the case where the potential of φVL is made deeper to let smear charges, developed when the capturing object is a light source having a significant amount of light, overflow and be swept-off into the drain.

FIG. 21A depicts a potential diagram when (i) the column CCD terminal gate 212 is set to the LOW level voltage and (ii) unnecessary charges, such as smear signals in empty packets, accumulate before the HIGH level voltage is applied to the drain gate 250 (t=0 in FIG. 20).

FIG. 21B depicts a potential diagram when the HIGH level voltage is applied to the drain gate 250 to start sweeping-off the charges into the drain 251 (t=1 in FIG. 20). The application of the HIGH level voltage makes it possible to obtain an electric field higher than that generated when the drain gate 250 is under the two-valued control with the MIDDLE level voltage applied to for transferring the charges to the drain 251. Hence, this operation allows the unnecessary charges to be easily swept-off into the drain 251, and successfully solves the problem of variation in sweeping-off of the unnecessary charges for each column.

FIG. 21C depicts a potential diagram when the HIGH level voltage is applied to the drain gate 250, and the charges are being swept-off into the drain 251 (t=2 in FIG. 20). When the HIGH level voltage is applied to the drain gate 250, a gate (the junction unit 221) behind an accumulation transfer gate is set from the MIDDLE level voltage to the LOW level voltage. Such a voltage setting causes the voltage to be fixed at the well to secure an electric field occurring in a direction to the drain for sweeping-off.

FIG. 21D depicts a potential diagram when the HIGH level voltage is applied to the drain gate 250, and the charges are being swept-off into the drain 251 (t=3 in FIG. 20). When the HIGH level voltage is applied to the drain gate 250 and the unnecessary charges are swept-off into the drain 251, setting the splitting unit 211 to the LOW level voltage makes transfer electric fields higher among the splitting unit 211, the drain gate 250, and the drain 251. This operation makes it easier to sweep-off the charges into the drain 251.

It is noted that when the HIGH level voltage is applied to the drain gate 250 and the unnecessary charges are swept-off into the drain 251 (t=1 in FIG. 20), adjustment may be made with regard to the injection condition and the injection region of the p-type impurity into the charge transfer channel 270 provided below the drain gate 250, such that the drain gate 250 and the drain 251 are at the same electric potential; that is, the potential in FIG. 21E.

FIG. 22 shows a potential distribution when the Middle level voltage is applied to the drain gate 250; that is, a potential distribution in transfer control unit 201 during the row scanning period.

FIG. 22 depicts a potential diagram showing that, when a capturing object is a light source having a significant amount of light, the signal charge packets and the empty packets of the transfer control unit 209 overflow under the drain gate, and are swept-off into the drain 251. During the row scanning period, the column CCD terminal gate 212 is set to the LOW level voltage and the other gates are set to the MIDDLE level voltages, such that the signal charge packets and the empty packets are generated. Here, provided to the drain gate 250 is a potential deeper than the potential barrier generated by the application of the MIDDLE level voltage to the drain gate 250 and the setting of the column CCD terminal gate 212 to the LOW level voltage. This operation causes the smear charges and the blooming charges, generated when the capturing object is a light source having a significant amount of light, to overflow the drain gate 250 and to be swept-off into the drain 251 before overflowing the column CCDs into the row CCD 300. This contributes to eliminating deterioration in images.

The keys in FIG. 22 are the potentials of the drain gate 250 and the column CCD terminal gate 212. This is because, in the case where the potential of the column CCD terminal gate 212 is deeper than that of the drain gate 250, the smears and the blooming charges, generated when the capturing object is a light source having a significant amount of light, inevitably overflow the column CCDs into the row CCD 300, causing deterioration in images. The potential of the drain gate 250 can be adjusted easily by the change of (i) the area into which the p-type impurity is injected and (ii) the amount of the p-type impurity to be injected, when the p-type impurity region 280 is formed in the charge transfer channel 270 of the drain gate 250. When the drain gate 250 is under the two-valued control, the adjustment in the potential of the drain gate 250 has to be made within the width of the charge transfer channel of the drain gate 250. No problem would be developed when the potential is adjusted by making the width of the charge transfer channel narrower; however, when the potential is adjusted by making the width of the charge transfer channel wider, the shape of the drain gate 250 needs to be inevitably changed, as well. Such a change requires an extra cost.

As a technique of forming the drain 251, described above is the case where a high voltage (10 V, for example) is externally applied to the drain forming portion of the substrate on which the solid-state imaging device is formed. Another technique of which is to remove a barrier developed by an impurity between the drain forming portion and the deep part of the substrate. The change in the form and the injection condition of the impurity makes the potential, of the side wall to the drain 251, deeper than the vicinity of the side wall. This structure can overflow the unnecessary charges into the drain 251. Such a technique can overflow the unnecessary charges into the drain 251 even though the layout shows no drain gate 250. This technique, however, makes a difficulty in adjusting a potential for sweeping-off the unnecessary charges. Furthermore, the technique would generate a smear when a shutter pulse is applied for sweeping-off the unnecessary charges into the substrate. Moreover, even though the technique is intended to overflow the unnecessary charges into the drain 251 to sweep-off the unnecessary charges to the drain gate 250 when the capturing object is a light source having a significant amount of light, the significant amount of charges make the potential where the unnecessary charges overflow shallow. This problem makes it difficult to sweep-off the charges into the drain 251. In contrast, in Embodiment 9, the gate control is carried out by the drain gate 250. Thus, Embodiment 9 can reduce such a problem.

Figure 23A:
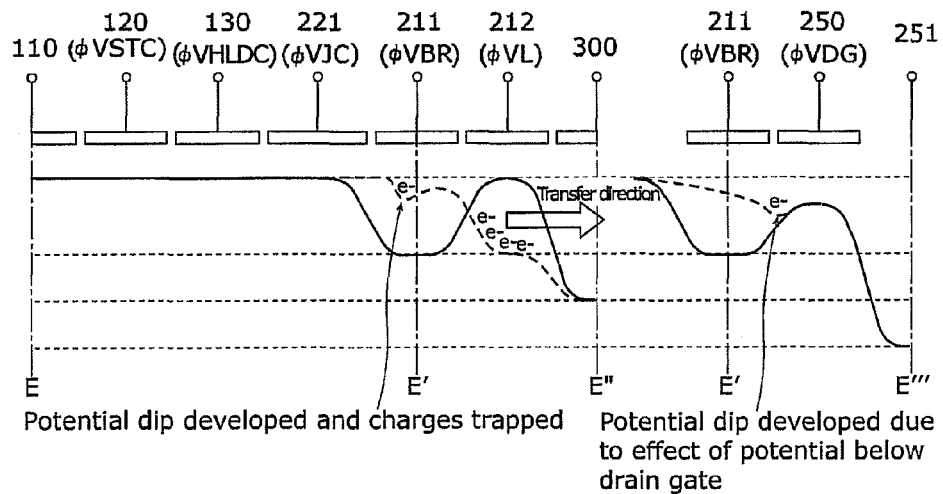
FIG. 23A shows how the signal charge packets of the transfer control unit according to Embodiment 9 of the present invention are transferred when a Middle level voltage is applied to a drain gate.

FIG. 23A shows a potential distribution in the transfer control unit 201 when the LOW level voltage is applied to the drain gate 250; that is, when a signal packet is transferred from the splitting unit 211 next to the drain gate to the column CCD terminal gate 212.

Figure 23B:
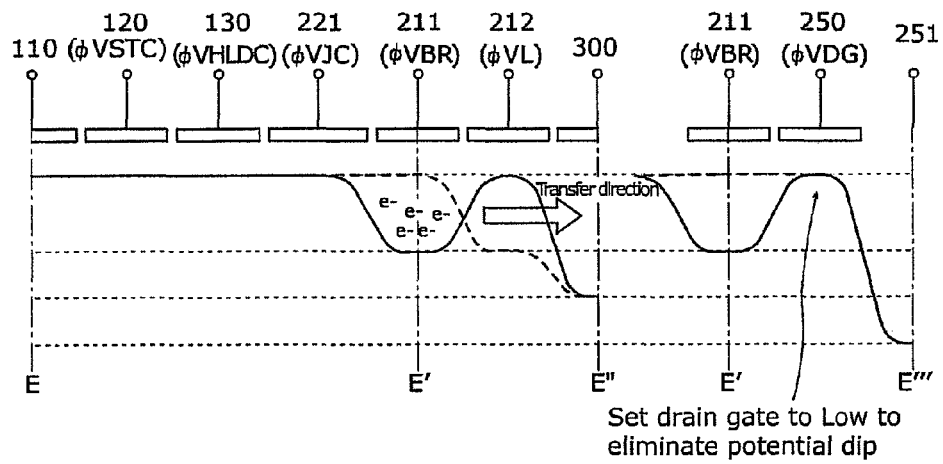
FIG. 23B shows how the signal charge packets of the transfer control unit according to Embodiment 9 of the present invention are transferred when a Low level voltage is applied to the drain gate.
Figure 24:
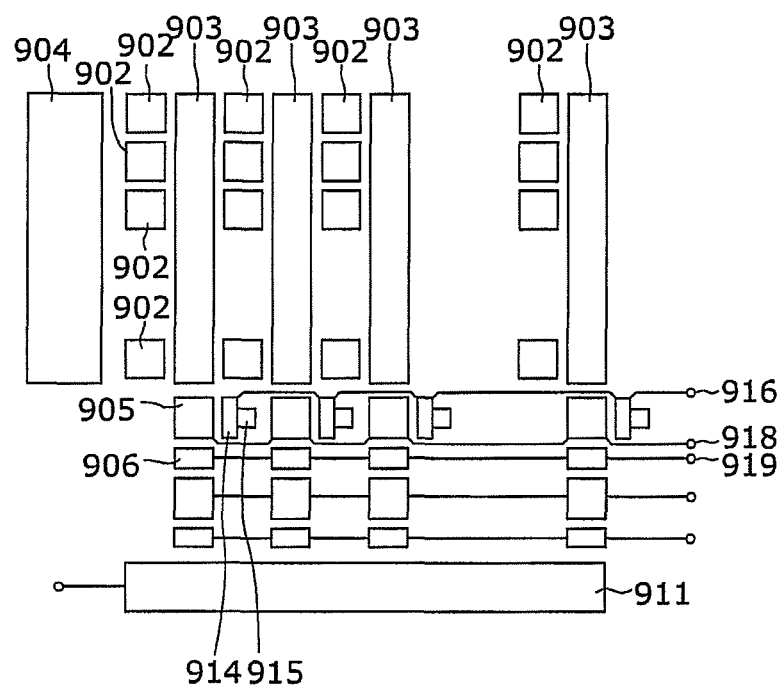
FIG. 24 shows a schematic block diagram of a conventional CCD solid-state imaging device.

In the case where the drain gate 250 is left to be the MIDDLE level voltage, the potential modulation of the drain gate 250 causes a potential dip. Then, part of the signal charges are trapped in the potential dip, leading to a transfer defect. The defective image here has a black line thereon. Especially, in the case where the capturing object is a light source having a small amount of light, the defect is emphasized, and appears on the image. Hence, only in the case where the charges are transferred from the splitting unit 211 next to the drain gate 250 to the column CCD terminal gate 212; that is, when the charges are transferred from the second column CCD 210 to the row CCD 300, the LOW level voltage is applied to the drain gate 250 to have no potential modulation. This operation successfully eliminates a column transfer defect of the drain gate 250 caused by the potential dip. FIG. 23B shows the above case in a potential diagram. When the drain gate 250 is under the two-valued control, the drive shown here cannot be carried out. Thus, the drain gate 250 is always at the risk of a column transfer defect. In this regard, the application of pulses to the drain gate 250 is under the three-valued control. This eliminates the column transfer defect and increases a yield ratio, leading to a great advantage cost-wise.

The above has described each of the cases where three values (the HIGH level voltage, the MIDDLE level voltage, and the LOW level voltage) of voltages are applied to the drain gate 250. In order to drive the solid-state imaging device by the three-valued control with no problem, the potential adjustment of the drain gate 250 is a key. Since widening the line width of the charge transfer channel 270 of the drain gate 250 would also require the change of the drain gate 250, no more than a minimum essential potential adjustment is possible; however, with the changes in the line width and the injection condition of the p-type impurity region 280 formed in the charge transfer channel 270 of the drain gate 250, the potential can be easily adjusted.

As described above, the control of the drain gate 250 using the three pulses can simultaneously achieve the following three points: the reduction of smears by sweeping-off smear signals in an empty packet; the reduction of image deterioration developed in the case where a capturing object is a light source having a significant amount of light, and the smears and the blooming charges caused by such a capturing object overflow the column CCDs into the row CCD 300; and the correction of the column transfer defect caused by the potential dip of the drain gate 250. These achievements significantly contribute to an improvement in anti-smear characteristics and to the reduction of costs thanks to the rise of a yield ratio.

It is noted that the above description is an example of the drain 251 provided at a gate location before the column CCD terminal gate 212; however, the location shall not be limited to this.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

For example, the structure of the transfer control unit 202 in FIG. 12A may be used for the solid-state imaging devices according to Embodiments 3 to 9.

Industrial Applicability

The present invention is used for solid-state imaging devices and driving methods for the solid-state imaging devices and, in particular, for a digital camera and a video camera obtaining high image quality.

What is claimed is:

1. A solid-state imaging device comprising:
photo diodes which are arranged two-dimensionally;
first column charge coupled devices (CCDs) each of which is provided to a corresponding one of columns of said photo diodes, reads charges from said photo diodes provided to the corresponding column, and transfers the charges in a column direction;
a row CCD which transfers, in a row direction, part of the charges transferred by said first column CCDs;
a drain into which the rest of the charges transferred by said first column CCDs are swept-off; and
transfer control units each of which is provided to corresponding said first column CCDs, and transfers, to said row CCD and to said drain, the charges transferred by said corresponding first column CCDs,
wherein each of said transfer control units includes:
a second column CCD which transfers, in a column direction, the charges transferred by said first column CCDs corresponding to said transfer control unit; and
a column CCD terminal gate which is provided between said second column CCD and the row CCD, and forms a potential barrier between said second column CCD and said row CCD.

2. The solid-state imaging device according to claim 1, wherein each of said transfer control units further includes:
a junction unit which is provided between said first column CCDs corresponding to said transfer control unit and said second column CCD, and is configured to transfer, to said second column CCD, the charges transferred by said first column CCDs corresponding to said transfer control unit; and
a drain gate which is provided between said second column CCD and said drain, and forms a potential barrier between said second column CCD and said drain.

3. The solid-state imaging device according to claim 1, wherein said transfer control unit further includes:
a junction unit which is provided between said first column CCDs corresponding to said transfer control unit and said second column CCD, and is configured to transfer, to said second column CCD, the charges transferred by said first column CCDs corresponding to said transfer control unit; and a drain gate which is provided between junction unit and said drain, and forms a potential barrier between junction unit and said drain.

4. The solid-state imaging device according to claim 1, wherein said transfer control unit further includes:

a junction unit which is provided between said first column CCDs corresponding to said transfer control unit and said second column CCD, and is configured to transfer, to said second column CCD, the charges transferred by said first column CCDs corresponding to said transfer control unit; and hold gates each of which is provided to a corresponding one of said first column CCDs that are corresponding to the transfer control unit, and forms a potential barrier between said corresponding first column CCD and said junction unit, and in said transfer control unit, space between channels of said hold gates, corresponding to said first column CCDs neighboring to each other, is narrower than space between channels of said neighboring first column CCDs.

5. The solid-state imaging device according to claim 1, wherein drains including said drain are provided on both sides of said transfer control unit, and said transfer control unit further includes drain gates each of which (i) is provided between said second column CCD and said drains provided on the both sides of said second column CCD and (ii) forms a potential barrier between said second column CCD and said drain.

6. The solid-state imaging device according to claim 1, wherein said drain is provided between transfer control units including said transfer control unit and neighboring to each other so as to receive charges to-be-swept-off of said neighboring transfer control units, said transfer control unit further includes a drain gate which is provided between said second column CCD and said drain, and forms a potential barrier between said second column CCD and said drain.

7. The solid-state imaging device according to claim 5, wherein said drain gates of transfer control units, including said transfer control unit and neighboring to each other, share one gate electrode, and potentials of said drain gates of said neighboring transfer control units are controlled by the one gate electrode.

8. The solid-state imaging device according to claim 2, wherein drain gates, including said drain gate, for all of said transfer control units are connected to one terminal to which a driving pulse is supplied for driving said drain gates, and column CCD terminal gates, including said column CCD terminal gate, for all of said transfer control units are connected to one terminal to which a driving pulse is supplied for driving said column CCD terminal gates.

9. The solid-state imaging device according to claim 2, wherein said drain gates for said transfer control units are connected to terminals to which different driving pulses are supplied for driving said drain gates.

10. The solid-state imaging device according to claim 1, wherein said first column CCDs, said transfer control units, and said row CCD are configured to transfer packets including charges to be transferred by successive potential wells separated by potential barriers, and each of said transfer control units is configured to (i) selectively transfer, to said row CCD, a packet included in the packets and transferred by a predetermined one of said first column CCDs which correspond to said transfer control unit and (ii) selectively transfer, to said drain, a packet included in the packets and transferred by an other one of said first column CCDs which is different from the predetermined first column CCD, said first column CCDs corresponding to said transfer control unit.

11. The solid-state imaging device according to claim 1, wherein, during a row scanning period, each of said transfer control units is configured to transfer the charges of said second column CCD to said drain, with the potential barrier formed between said second column CCD and said row CCD.

12. The solid-state imaging device according to claim 1, wherein said first column CCDs, said transfer control units, and said row CCD are configured to transfer packets including charges to be transferred by successive potential wells separated by potential barriers, and each of said transfer control units is configured to selectively transfer (i) to said row CCD, a packet included in the packets and having signal charges, and (ii) to said drain, a packet included in the packets and not having the signal charges.

13. The solid-state imaging device according to claim 1, wherein said first column CCDs, said transfer control units, and said row CCD are configured to transfer packets including charges to be transferred by successive potential wells separated by potential barriers, and each of said transfer control units is configured to (i) transfer, to said row CCD, part of the packets sequentially transferred by a predetermined one of said first column CCDs which correspond to said transfer control unit and (ii) to transfer, to said drain, the other sequentially transferred packets.

14. The solid-state imaging device according to claim 10, wherein said transfer control unit is configured to transfer the packets to said drain across row scanning periods.

15. The solid-state imaging device according to claim 1, wherein said first column CCDs, said transfer control units, and said row CCD are configured to transfer packets including charges to be transferred by successive potential wells separated by potential barriers including the potential barrier, and when an imaging unit has (i) said photo diodes two-dimensionally arranged (ii) a signal output area of which angle of view is greater in width than in height with respect to an aspect ratio of said imaging unit in said imaging unit and (iii) a signal sweeping-off area which is an area other than said signal output area in said imaging unit, each of said transfer control units is configured to (i) transfer, to said row CCD, a packet included in the packets and having signal charges from said photo diodes included in said signal output area and (ii) transfer, to said drain, a packet included in the packets and having signal charges from said photo diodes included in said signal sweeping-off area.

16. The solid-state imaging device according to claim 2, wherein, in the case where a same voltage is applied to said drain gate and said second column CCD, a channel region below said drain gate has a potential shallower than a potential of a channel region in said second column CCD.

17. A method for driving a solid-state imaging device which includes:

photo diodes arranged two-dimensionally;

first column CCDs each of which is provided to a corresponding one of columns of the photo diodes, reads charges from said photo diodes provided to the corresponding column, and transfers the charges in a column direction;

a row CCD which transfers, in a row direction, part of the charges transferred by the first column CCDs; and a drain into which the rest of the charges transferred by the first column CCDs are swept-off, the first column CCDs, and the row CCD transferring packets including charges to be transferred by successive potential wells separated by potential barriers, and said method comprising selectively transferring (i) to said row CCD, a packet included in the packets and transferred by a predetermined one of the first column CCDs and (ii) to said drain, a packet included in the packets and transferred by an other one of the first column CCDs being different from the predetermined first column CCD.

18. The method for driving the solid-state imaging device according to claim 17, further comprising forming a potential barrier between the first column CCD and the row CCD in the case where the transfer of the packet to the row CCD is suspended.

19. The method for driving the solid-state imaging device according to claim 17, wherein the solid-state imaging device further includes:

transfer control units each of which is provided to the corresponding first column CCDs, and transfers, to the row CCD and to the drain, the charges transferred by the corresponding first column CCDs, each of the transfer control units includes:

a second column CCD which transfers, in a column direction, the charges transferred by the first column CCDs corresponding to the transfer control unit; and a drain gate which is provided between the second column CCD and the drain, and forms a potential barrier between the second column CCD and the drain, and said method further comprising supplying three-valued driving pulses including a HIGH level voltage, a MIDDLE level voltage, and a LOW level voltage to the drain gate.

20. The method for driving the solid-state imaging device according to claim 19, further comprising applying the MIDDLE level voltage to the drain gate during a period in which the charges are transferred by the row CCD in a row direction.

21. The method for driving the solid-state imaging device according to claim 19, further comprising supplying the Low level voltage to the drain gate when the charges are transferred from the second column CCD to the row CCD.

\* \* \* \* \*